United States Patent
Kato et al.

[11] Patent Number: 6,055,197
[45] Date of Patent: Apr. 25, 2000

[54] SEMICONDUCTOR MEMORY DEVICE WITH SIMULTANEOUSLY ACTIVATED ELEMENTS AND A REDUNDANCY SCHEME THEREOF

[75] Inventors: Daisuke Kato; Yohji Watanabe, both of Yokohama, Japan

[73] Assignee: Kabushiki Kaisha Toshiba, Kanagawa-Ken, Japan

[21] Appl. No.: 09/213,651

[22] Filed: Dec. 16, 1998

[30] Foreign Application Priority Data

Dec. 18, 1997 [JP] Japan .................................. 9-348409
Dec. 3, 1998 [JP] Japan ................................. 10-344579

[51] Int. Cl.⁷ ............................................ G11C 7/00
[52] U.S. Cl. ................. 365/200; 365/230.03; 365/225.7; 365/189.07
[58] Field of Search ........................... 365/200, 230.03, 365/225.7, 189.07

[56] References Cited

U.S. PATENT DOCUMENTS 5,544,113  8/1996  Kirihata et al. ......................... 365/200
5,561,636  10/1996 Kirihata et al. ......................... 365/201
5,901,094  5/1999  Chin et al. .............................. 365/200
5,936,269  8/1999  Kusaba .................................... 257/208

OTHER PUBLICATIONS

Kirihata, et al. "Fault–Tolerant Designs for 256 Mb DRAM," IEEE Journal of Solid–State Circuits, vol. 31, No. 4, Apr. 1996 pp. 558–566.

*Primary Examiner*—Andrew Q. Tran
*Attorney, Agent, or Firm*—Loeb & Loeb, LLP

[57] ABSTRACT

In a semiconductor memory device, assuming that the ratio of a memory capacity of a region of a memory array per one of elements, which are simultaneously activated in the memory array in which x elements (x is an integer of two or more) are simultaneously activated and which is divided into a plurality of repair regions, each of which has at least two elements, to a memory capacity in one of the repair regions corresponding to one of spare element groups is y (y is an integer of one or more), each of the repair regions is designed so that a plurality of elements are simultaneously activated in its own repair region, and each of the spare element groups is designed so that the number of spare elements simultaneously activated in each of the spare element groups is one. Thus, it is possible to effectively reduce electric current consumption in the total of redundant control circuits.

15 Claims, 15 Drawing Sheets

SEMICONDUCTOR MEMORY DEVICE WITH SIMULTANEOUSLY ACTIVATED ELEMENTS AND A REDUNDANCY SCHEME THEREOF

BACKGROUND OF THE INVENTION

1. Field of the Invention

The present invention relates to a semiconductor memory device having a defect repairing redundant circuit.

2. Related Background Art

As shown in FIG. 20, a typical dynamic random access memory (DRAM) comprises a memory array 51, a row decoder 61, a column decoder 71 and an I/O control circuit 75. The memory array 51 has a plurality of memory cells 53 arranged as a matrix, a plurality of word lines 55 and a plurality of bit lines 57. Each of the memory cells 53 generally comprises a MOS transistor 53a and a capacitor 53b. The gate of the transistor 53a is connected to one of the word lines 55. One of the source and drain of the transistor 53a is connected to one of the bit lines 57, and the other is connected to one of the electrodes of the capacitor 53b in the same memory cell. Furthermore, the other electrode of the capacitor 53b is connected to a power supply line having a predetermined potential. In addition, the gate of at least one transistor 53a is connected to each of the word lines 55, and one of the source and drain of at least one transistor 53a is connected to each of the bit lines 57.

In the DRAM with such a construction, when a row address and a column address are inputted from the outside, the row decoder 61 selects a word line 55 or a predetermined number of word lines 55 on the basis of the row address to activate the selected word lines 55, and the column decoder 71 selects a column selection line 73 or a predetermined number of column selection lines 73 on the basis of the column address to activate the selected column selection lines 73. Since a pair of bit lines or pairs of bit lines are connected to one of the column selection lines 73 via a column switch, the pair or pairs of bit lines connected to the activated column selection lines 73 are activated. Thus, data are read out of the corresponding memory cell or data are written in the corresponding memory cell by means of the I/O control circuit 75.

Large-scale semiconductor memory device, such as DRAMs, have a defect repairing redundant circuit in order to enhance the yield of products. The redundant circuit has spare elements arranged for a plurality of elements in a memory array. Furthermore, throughout the specification, the term "element" means a row element (a word line or a bundle of a predetermined number of word lines) or a column element (a pair of bit lines or a bundle of a predetermined number of bit lines, or a column selection line or a bundle of a predetermined number of column selection lines). The term "spare element", which will be described later, means the same.

A typical DRAM memory array determines how many elements are simultaneously activated in the whole array, in view of electric power consumption, the number of data outputs in the whole chip and so forth. In addition, the DRAM memory array are divided into a plurality of blocks so that only one element is simultaneously activated in one of the blocks. The redundant circuit predicts the defect distribution in the whole array and determines a number of spare element groups necessary to a block of a specific capacity. That is, a repair region of a specific capacity (area), in which the spare element groups can freely repair defects, is determined. Each of the spare element groups has a plurality of spare memory cells, and a plurality of spare elements, each of which selects a predetermined number of spare memory cells. Similar to the memory cell, each of the spare memory cells comprises a MOS transistor and a capacitor.

FIG. 21 shows an example of the arrangement of a redundant circuit of a conventional DRAM memory array 1. In this example, the memory array 1 is divided into two memory blocks 1a and 1b which sandwich a sense amplifier 2 therebetween. Spare element groups 3a and 3b, each of which has n spare elements, are arranged so as to belong to the respective memory blocks 1a and 1b in order to replace defective elements of a plurality of elements 5a and 5b in the respective blocks 1a and 1b. That is, a range in which defects are repaired by the spare element group 3a corresponds to the memory block 1a. This memory block 1a is a repair region corresponding to the spare element group 3a. Similarly, the memory block 1b is a repair region corresponding to the spare element group 3b.

In a case where each of the elements 5a and 5b is a row element (i.e., a word line or a bundle of word lines), a pair of bit lines in the respective blocks 1a and 1b are designed to be connected to all of the word lines and the spare word lines in the spare element groups 3a and 3b via the gates of cell transistors, the drains (or sources) of which are connected to the pair of bit line. Therefore, when a plurality of word lines are simultaneously activated in the respective blocks 1a and 1b, data transmitted from a plurality of memory cells collide on the bit line. For that reason, the number of the word lines simultaneously activated in each of the blocks 1a and 1b (i.e., each of the repair regions) is only one, and the number of defective word lines capable of being simultaneously replaced is also only one. For the same reason, the number of the spare word lines simultaneously activated in each of the spare element groups 3a and 3b corresponding to each of the blocks 1a and 1b is also only one.

In a case where the elements 5a and 5b are column elements (i.e., column selection lines), each of the spare element groups 3a and 3b has n spare column selection lines. In addition, each of the blocks 1a and 1b serving as a repair region corresponding to each of the spare element groups 3a and 3b has a plurality of column selection lines which are connected to data lines via the gates of column switches (transistors), the drains (or sources) of which are connected to the same data line or the same pair of data lines. The spare column lines forming the spare elements are also connected to the same data line. Also in this case, the number of the column selection lines capable of being simultaneously activated in each of the blocks 1a and 1b is only one, and the number of the defective column selection lines capable of being simultaneously replaced is also only one. For the same reason, the number of the spare column selection lines capable of being simultaneously activated in each of the spare element groups 3a and 3b corresponding to each of the blocks 1a and 1b is also only one.

FIG. 22 shows an another example of the arrangement of a redundant circuit of a conventional DRAM memory array 1. In this example, the memory array 1 is arranged as a redundant array including spare element groups 3a and 3b which have word and bit lines independent of memory blocks 1a and 1b. Also in this case, the number of elements simultaneously activated for each of the blocks 1a and 1b is only one, and each of the blocks 1a and 1b serves as a repair region wherein defects are repaired by each of the spare element groups 3a and 3b.

In this example, the memory array is divided into two parts so that the number of elements simultaneously activated in each of the blocks 1a and 1b is only one when two elements are simultaneously activated in the whole memory array, and each of the blocks 1a and 1b serves as a repair region. In addition, the spare element groups 3a and 3b for the respective blocks 1a and 1b are formed as separate arrays having bit and data lines independent of those of the memory blocks 1a and 1b, and all of the spare element groups 3a and 3b are connected to the same bit line and data line via the gate of a cell transistor or the gate of a column switch. Also in this case, the number of spare elements simultaneously activated in a redundant array formed by the spare element groups 3a and 3b is only one. Therefore, the number of defective elements capable of being simultaneously replaced in the whole memory array (1a, 1b) is only one.

In the conventional examples shown in FIGS. 21 and 22, the number x of elements simultaneously activated by the same address is 2. In addition, a ratio $y (=S_1/S_2)$ of a memory capacity (area) $S_1$ of a region (i.e., block 1a or 1b) of a memory array 1 per one of two elements simultaneously activated to a memory capacity (area) $S_2$ of a repair region (block 1a or 1b) repaired by a spare element group is 1. The number of elements simultaneously activated in a repair region is also 1 maximum.

In order to replace defective elements by the above described spare element groups 3a and 3b, a total of n redundant control circuits $RCTRL_1, \ldots RCTRL_n$ corresponding to the respective spare element groups 3a and 3b, each of which includes n spare elements, are used as shown in FIG. 23. Each of the redundant control circuits $RCTRL_1, \ldots RCTRL_n$ stores a defective address found by a test at the stage of a wafer, and controls the replacement of a defective element with a spare element when the defective address is inputted. Each of the redundant control circuits $RCTRL_1, \ldots RCTRL_n$ includes a fuse serving as a defective address storage circuit, a fuse latch circuit, a fuse circuit, a fuse decoding circuit, a comparing circuit and so forth. When an address is inputted, n redundant control circuits $RCTRL_1, \ldots RCTRL_n$ are activated with respect to each of x elements (x=2 in the examples shown in FIGS. 21 and 22) simultaneously activated, and it is detected whether the input address is coincident with an address programmed in each of the redundant control circuits $RCTRL_i$ by blowing the fuse.

When the input address is different from an address programmed in a certain redundant control circuit $RCTRL_i$ (i=1, ... n), a signal $ON_i$ is outputted from the redundant control circuit $RCTRL_i$. When all of n redundant control circuits $RCTRL_i$(i=1, ... n) output the signals ONi, a mismatch is detected by a NAND gate G1, and a repair region activating signal ENABLE is generated from an inverter G2. Thus, the replacement of elements is not carried out, and one element determined by the input address is activated in each of the repair regions.

When an address programmed in a certain redundant control circuit $RCTRL_i$ is inputted, the redundant control circuit $RCTRL_i$ does not output the signal $ON_i$, and outputs a spare element activating signal $REN_i$. By this spare element activating signal $REN_i$, the defective element is replaced with a spare element.

In either redundant circuit systems shown in FIGS. 21 and 22, since one element is simultaneously activated in the blocks 1a and 1b serving as the respective repair regions of the spare element groups 3a and 3b, it is required to detect the coincidence of the input address with the defective address and to control the replacement, i.e., to activate the n redundant control circuits $RCTRL_1, \ldots RCTRL_n$ shown in FIG. 23, for both of the spare element groups 3a and 3b when the address is inputted. More specifically, in the redundant circuit control system of the conventional DRAM, n redundant control circuits are simultaneously activated for each of x elements simultaneous activated (i.e., n·x redundant control circuits are simultaneously activated in the whole memory array) when an address is inputted. Therefore, there is a problem in that the total of redundant control circuits has great electric current consumption.

SUMMARY OF THE INVENTION

It is therefore an object of the present invention to eliminate the aforementioned problems and to provide a semiconductor memory device which can effectively reduce electric current consumption in the total of redundant control circuits.

In order to accomplish the aforementioned and other objects, according to one aspect of the present invention, a semiconductor memory device comprises: a memory array having a plurality of memory cells arranged in the form of an array, and a plurality of elements, each of which selects a predetermined number of memory cells from the plurality of memory cells, x elements (x is an integer of 2 or more) of the plurality of elements being simultaneously activated, and the memory array being divided into a plurality of repair regions, each of which has at least two of the elements; a plurality of spare element groups, each of which is provided so as to correspond to a corresponding one of the repair regions, each of the spare element groups having a plurality of spare memory cells, and a predetermined number of spare elements, each of the spare elements selecting a predetermined number of spare memory cells from the spare memory cells and being replaced with a defective element in a corresponding one of the repair regions; a plurality of redundant control circuits, each of which is provided so as to correspond to a corresponding one of the spare elements in a corresponding one of the spare element groups; and a plurality of control parts, each of which is provided so as to correspond to a corresponding one of the spare element groups, each of the control parts controlling the replacement of one of the spare elements in the corresponding one of the spare element groups with a defective element on the basis of at least an output of the redundant control circuits corresponding to the one of the spare elements in the corresponding one of the spare element groups, wherein the number of the repair regions is x·y assuming that a ratio of a memory capacity of a region of the memory array per one of elements simultaneously activated in the memory array to a memory capacity of one of the repair regions corresponding to one of the spare element groups is y (y is an integer of 1 or more), each of the repair regions being designed so that a plurality of the elements are simultaneously activated therein, and each of the spare element groups being designed so that the number of the spare elements simultaneously activated therein is one.

The memory array may be divided into x element groups, each of which has at least one element, each of the element groups being designed so that each of the elements contained in each of the element groups is identified by an address, and assuming that $x=r \cdot 2^p$ and $m-1 < \log_2 y \leq m$ (p and m are positive integers), each of the element groups may be divided into y sub-element groups on the basis of the difference in address of m bits, and x sub-element groups corresponding to the same address being divided into groups, each of which includes $2^p$ sub-element groups, each of the groups being divided into $2^p$ regions on the basis of the difference in address of p bits, each of the regions being set as a corresponding one of the repair regions for a corresponding one of the spare element groups.

Each of the spare element groups provided so as to correspond to the corresponding one of the repair regions may be arranged as a redundant array independent of the memory array.

One of the spare element groups corresponding to one of the repair regions may be arranged so as to belong to another of the repair regions in the memory array.

According to another aspect of the present invention, a semiconductor memory device comprises: a memory array having a plurality of memory cells arranged in the form of an array, and a plurality of elements, each of which selects a predetermined number of memory cells from the plurality of memory cells, the memory array being divided into a plurality of repair regions, each of which has at least two of the elements; a plurality of spare element groups, each of which is provided so as to correspond to a corresponding one of the repair regions, each of the spare element groups having a plurality of spare memory cells, and a predetermined number of spare elements, each of the spare elements selecting a predetermined number of spare memory cells from the spare memory cells and being replaced with a defective element in a corresponding one of the repair regions; a plurality of redundant control circuits, each of which is provided so as to correspond to a corresponding one of the spare elements in a corresponding one of the spare element groups; and a plurality of control parts, each of which is provided so as to correspond to a corresponding one of the spare element groups, each of the control parts controlling the replacement of one of the spare elements in the corresponding one of the spare element groups with a defective element on the basis of at least an output of the redundant control circuits corresponding to the one of the spare elements in the corresponding one of the spare element groups, wherein each of the plurality of spare element groups is independent of the memory array and divided into a plurality of redundant arrays independent of each other, each of the repair regions being set so that a plurality of the elements are simultaneously activated therein.

According to a further aspect of the present invention, a semiconductor memory device comprises: a memory array having a plurality of memory cells arranged in the form of an array, and a plurality of elements, each of which selects a predetermined number of memory cells from the plurality of memory cells, the memory array being divided into a plurality of repair regions, each of which has at least two of the elements; a plurality of spare element groups, each of which is provided so as to correspond to a corresponding one of the repair regions, each of the spare element groups having a plurality of spare memory cells, and a predetermined number of spare elements, each of the spare elements selecting a predetermined number of spare memory cells from the spare memory cells and being replaced with a defective element in a corresponding one of the repair regions; a plurality of redundant control circuits, each of which is provided so as to correspond to a corresponding one of the spare elements m a corresponding one of the spare element groups; and a plurality of control parts, each of which is provided so as to correspond to a corresponding one of the spare element groups, each of the control parts controlling the replacement of one of the spare elements in the corresponding one of the spare element groups with a defective element on the basis of at least an output of the redundant control circuits corresponding to the one of the spare elements in the corresponding one of the spare element groups, wherein each of the repair regions being set so that a plurality of the elements are simultaneously activated therein, each of the spare element groups being arranged so as to belong to a plurality of repair regions, each of which is different from the corresponding one of the repair regions and each of which includes an element which is not activated simultaneously with one of the elements in the corresponding one of the repair regions.

A defective element in each of the repair regions may be capable of being replaced with one of the spare elements in one of the spare element groups which are separately arranged in one of the repair regions including the defective element, the one of the spare element groups corresponding to one of the other repair regions.

The spare element groups may be arranged so that the spare elements in each of the spare element groups are capable of repairing defective elements in a plurality of repair regions.

According to a still further aspect of the present invention, a semiconductor memory device comprises: a memory array having a plurality of memory cells arranged in the form of an array, and a plurality of elements, each of which selects a predetermined number of memory cells from the plurality of memory cells, the memory array being divided into a plurality of repair regions, each of which has at least two of the elements, and the memory array having a plurality of operation modes which have different numbers of the elements simultaneously activated; a plurality of spare element groups, each of which is provided so as to correspond to a corresponding one of the repair regions, each of the spare element groups having a plurality of spare memory cells, and a predetermined number of spare elements, each of the spare elements selecting a predetermined number of spare memory cells from the spare memory cells and being replaced with a defective element in a corresponding one of the repair regions; a plurality of redundant control circuits, each of which is provided so as to correspond to a corresponding one of the spare elements in a corresponding one of the spare element groups; and a plurality of control parts, each of which is provided so as to correspond to a corresponding one of the spare element groups, each of the control parts controlling the replacement of one of the spare elements in the corresponding one of the spare element groups with a defective element on the basis of at least an output of the redundant control circuits corresponding to the one of the spare elements in the corresponding one of the spare element groups, wherein the repair regions are set so that, in an operation mode in which the number of the elements simultaneously activated is large, a plurality of the elements are simultaneously activated in each of the repair regions and the elements are simultaneously activated in the plurality of repair regions, and in an operation mode in which the number of the elements simultaneously activated is small, the number of the repair regions, in which the elements are simultaneously activated, decreases.

Assuming that the number of the elements simultaneously activated in each of the repair regions is m ($\geq 2$), each of the repair regions may be divided into m sub-regions so that the number of the elements simultaneously activated in each of the sub-regions is one, and each of the redundant control circuits may comprise: a sub-region determining circuit for determining one of the m sub-regions in which a defective element is capable of being replaced with one of the spare elements corresponding to a corresponding one of the redundant control circuits; an address storage circuit for programmably storing an address of the defective element; a comparing circuit for comparing an input address with an address stored in the address storage circuit to output a coincidence signal when the input address is coincident with the stored address, and to output a mismatch signal when the input address is not coincident with the stored address; a trigger signal generating circuit for generating a trigger signal on the basis of the mismatch signal outputted from the comparing circuit and a mismatch signal generated from another comparing circuit in another redundant control circuit corresponding to another spare element, which belongs to one of said spare element groups and is not activated simultaneously with a spare element corresponding to the redundant control circuit; and a non-replacement command signal generating circuit for generating m non-replacement command signals for commanding whether the spare element is replaced for each of the m sub-regions, on the basis of the trigger signal outputted from the trigger signal generating circuit, the mismatch signal outputted from the comparing circuit, and an output of the sub-region determining circuit.

BRIEF DESCRIPTION OF THE DRAWINGS

The present invention will be understood more fully from the detailed description given hereinbelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

Figure 1:
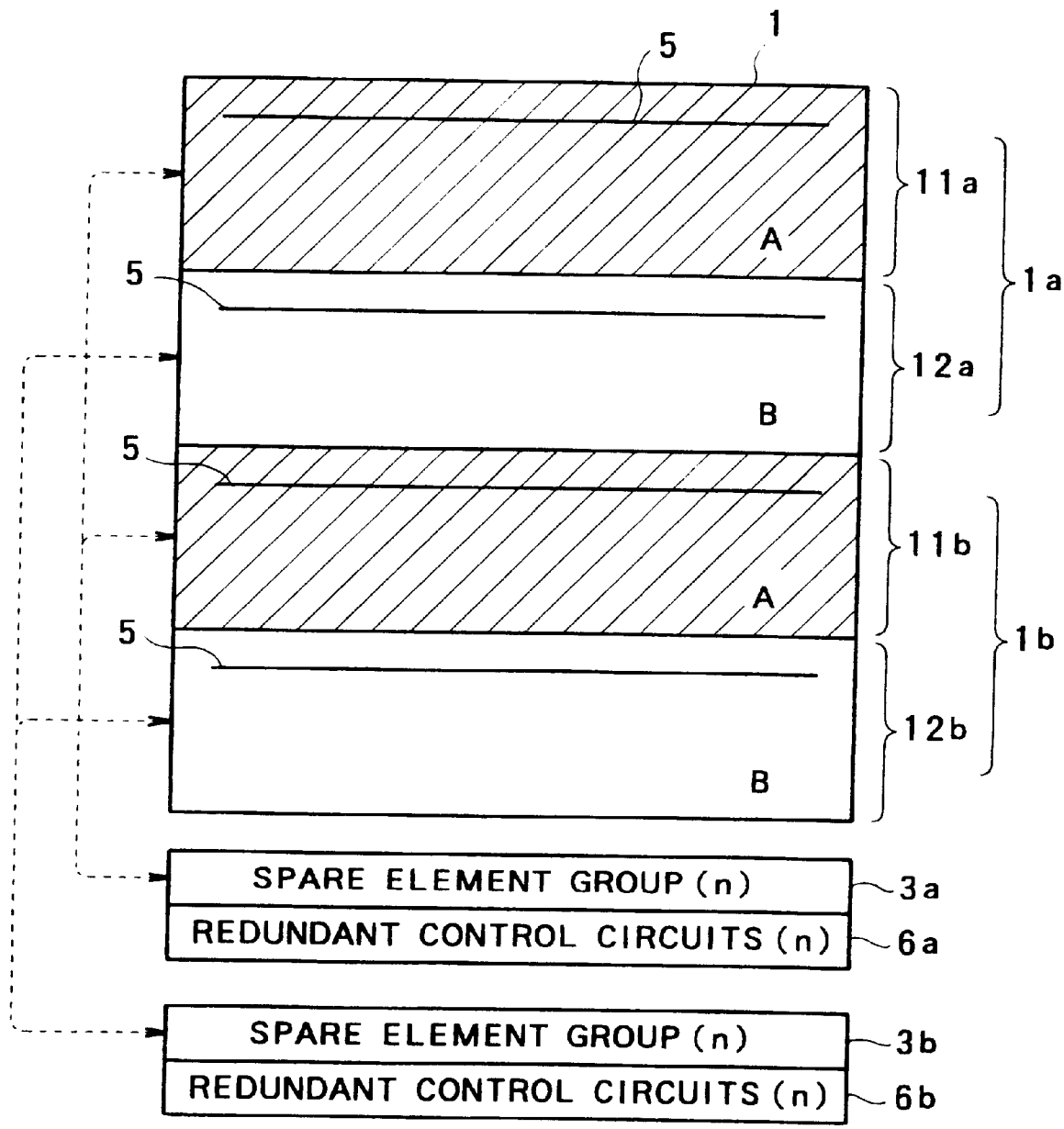
FIG. 1 is a schematic view for explaining the first preferred embodiment of a semiconductor memory device according to the present invention.

FIG. 1 schematically shows the construction of the first preferred embodiment of a semiconductor memory device according to the present invention. In this preferred embodiment, the semiconductor memory device is a DRAM which comprises a memory array 1, spare element groups 3a and 3b and redundant control circuits 6a and 6b. The memory array 1 is divided into two element groups 1a and 1b, each of which includes a plurality of elements. The element group 1a is divided into two regions 11a and 12a, and the element group 1b is divided into two regions 11b and 12b. The same address is assigned to the element groups 1a and 1b. In addition, the same address is assigned to the regions 11a and 11b, and the same address is assigned to the regions 12a and 12b. By the same address, an element 5 is selected from each of the element groups 1a and 1b to be activated. Therefore, in this preferred embodiment, the number x of elements simultaneously activated in the memory array 1 is 2.

Figure 21:
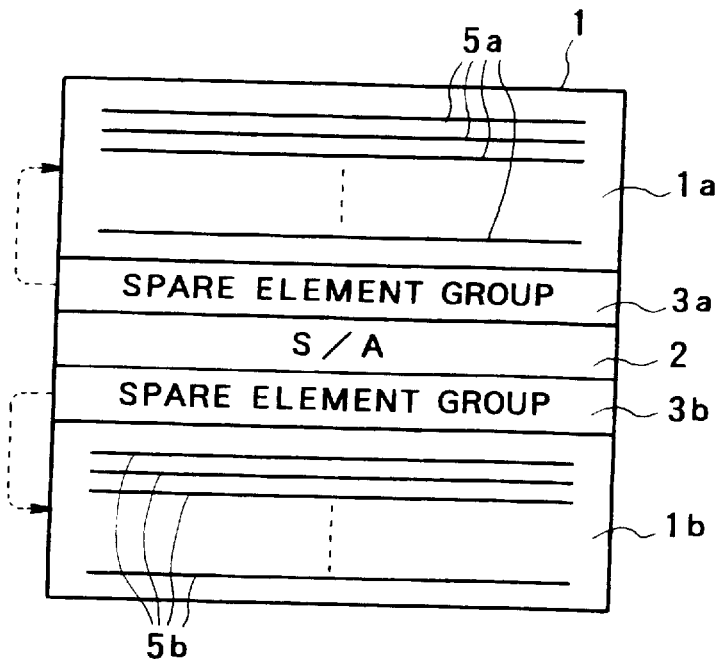
FIG. 21 is a schematic view for explaining a redundant circuit system in a conventional DRAM.
Figure 22:
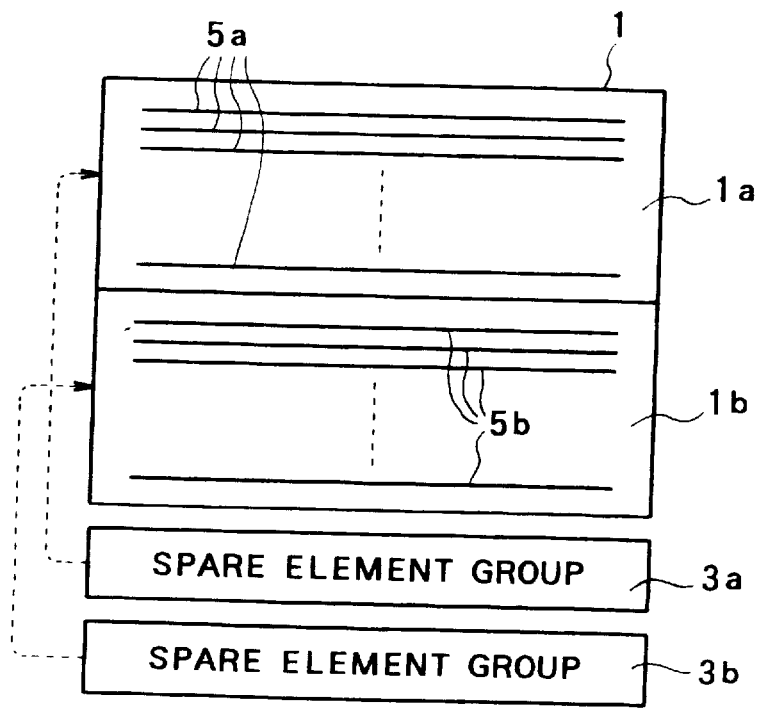
FIG. 22 is a schematic view for explaining another redundant circuit system in a conventional DRAM.

Each of the spare element groups 3a and 3b has n spare elements. As shown by slant lines in FIG. 1, the repair region of the memory array 1 repaired by the spare element group 3a is a region A consisting of the regions 11a and 11b, to which the same address is assigned in the element groups 1a and 1b. In addition, the repair region of the memory array 1 repaired by the spare element group 3b is a region B consisting of the regions 12a and 12b, to which the same address is assigned. Therefore, a ratio y ($=S_1/S_2$) of a memory capacity (area $S_1$) of a region of the memory array 1 per one of elements simultaneously activated to a memory capacity (area $S_2$) of a repair region repaired by one of the spare element groups is 1, similar to the conventional examples shown in FIGS. 21 and 22.

However, in this preferred embodiment unlike the conventional examples, two elements 5 are set to be simultaneously activated in each of the repair regions A and B. In the conventional examples, only one element is activated in each of the repair regions.

In this preferred embodiment, each of the spare element groups 3a and 3b is designed so that the number of spare elements simultaneously activated is one.

Figure 23:
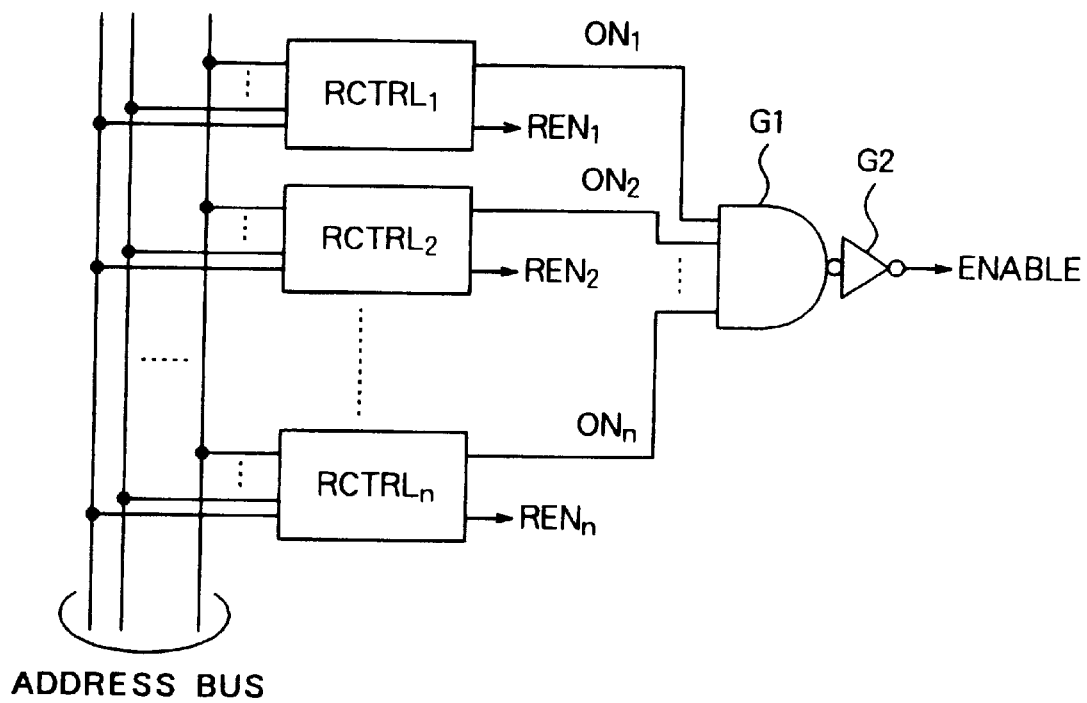
FIG. 23 is a diagram showing a redundant control circuit in a conventional DRAM.

The spare element group 3a is controlled by the control part 6a, and the spare element group 3b is controlled by the control part 6b. Each of the control parts 6a and 6b has n redundant control circuits $RCTRL_1, \ldots, RCTRL_n$, similar to the conventional case shown in FIG. 23.

In this preferred embodiment, for example as shown by the slant lines in FIG. 1, when two elements 5 in one repair region A (i.e. the regions 11a and 11b) in the memory array 1 are simultaneously activated, one control part 6a must be active in order to detect the coincidence of an input address for selecting the elements 5 in the regions 11a and 11b with a defective address stored in the fuse circuit and in order to control the replacement of the elements 5 with spare elements. At this time, an address for selecting elements in the other repair region B (i.e., the regions 12a and 12b) is not inputted, so that it is not required to detect the coincidence of an input address with a defective address in the fuse circuit. Therefore, the control part 6b corresponding to the repair region B can be maintained to be inactive. Specifically, assuming that values "0" and "1" of a bit A<k> of a digit number k of a certain address selectively determine the set of the regions 11a and 11b or the set of the regions 12a and 12b, one of the control parts 6a and 6b may be enable and the other control part 6a or 6b may be disable on the basis of the bit value A<k>.

Therefore, in this preferred embodiment, the electric current consumption of the total of redundant control circuits can be reduced to half of that in the conventional system for simultaneously activating only one element in the repair region corresponding to each of the spare element groups.

Figure 2:
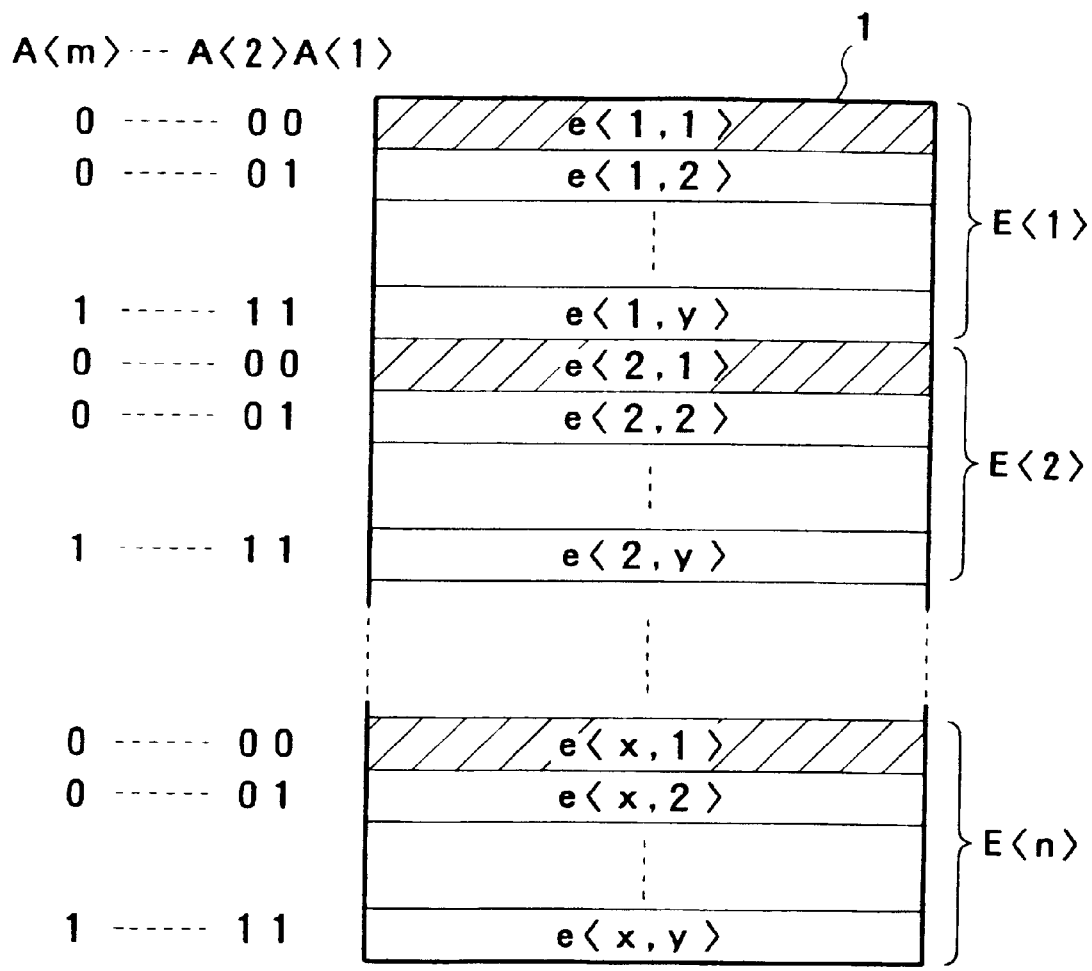
FIG. 2 is a schematic view for explaining the setting of repair regions in the second preferred embodiment of a semiconductor memory device according to the present invention.
Figure 3:
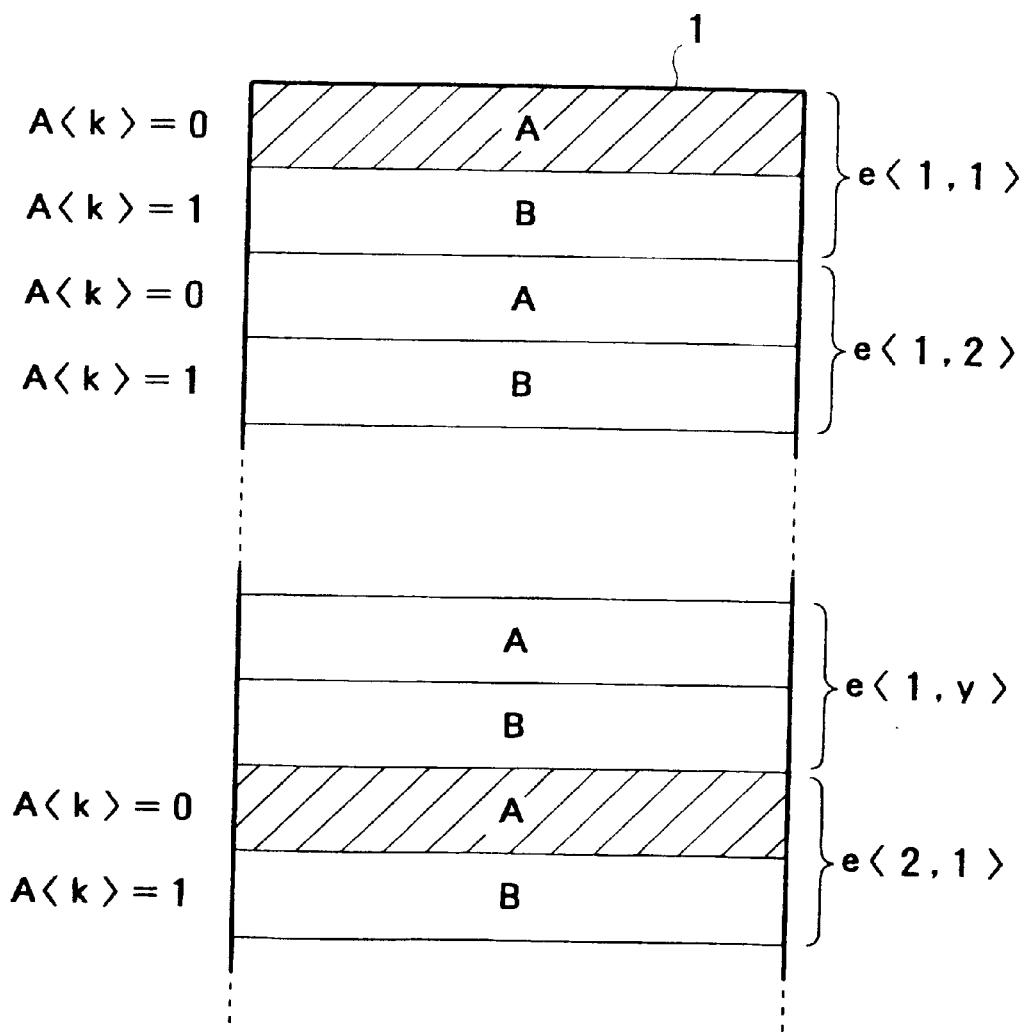
FIG. 3 is a schematic view for explaining the setting ol repair regions in the second preferred embodiment.

Also in the first preferred embodiment shown in FIG. 1, the number x of elements simultaneously activated in the memory array 1 has been 2, and the ratio y (=$S_1/S_2$) of the memory capacity (area $S_1$) of the region of the memory array 1 per one of elements simultaneously activated to the memory capacity (area $S_2$) of the repair region corresponding to one of the spare element groups has been 1. Referring to FIGS. 2 and 3, the generalized case, i.e., the case where x≧2 and y≧1, will be described as the second preferred embodiment of the present invention.

In this second preferred embodiment, a semiconductor memory device comprises a memory array 1 having a plurality of elements, x·y spare element groups, each of which has a predetermined number (n) of spare elements, and n redundant control circuits provided for the respective spare element groups.

The memory array 1 is divided as shown in FIG. 2. That is, the memory array 1 is divided into x element groups E<i> (i=1~x), and each of the element groups is divided into y sub-elements e<i, j> (j=1~y). A repair region is set so that the x elements may be simultaneously activated in the memory array 1 and a plurality of elements may be simultaneously activated in the repair region which is a region of 1/(x·y) of the whole memory array.

Now assuming that p and m are positive integers, x=r·$2^p$ and m−1<$\log_2$y≦m, specifically when a repair region corresponding to a spare element group having n spare elements (a partial region of 1/(x·y) of the whole memory array as described above) is set, each of the element groups E<i> (i=1, . . . , x) is divided into y sub-element groups e<i, j> (j=1, . . . , y) on the basis of the difference in an m-bit address A<m>. . . A<2>A<1> as shown in FIG. 2, and the whole memory array 1 is divided into r·y groups, each of which consists of a plurality ($2^p$) of sub-element groups (p≧1) of x sub-element groups e<i, j> (i=1~x) corresponding to the same address. Then, each of the groups is divided into $2^p$ regions by the difference in p addresses so that a repair region of a spare element region corresponds to each of the divided regions. In this case, the number of elements simultaneously activated in the repair region is $2^p$. If the repair region is thus set, n redundant control circuits for controlling the corresponding spare element groups are activated for each of the repair regions when an address is inputted. Therefore, in this preferred embodiment, n·x/$2^p$ redundant control circuits of the whole memory array are only activated, so that the electric current consumption of the total of the redundant control circuits is reduced to 1/$2^p$ of that in the conventional case where n·x redundant control circuits are activated.

FIG. 3 shows an example of p=1, i.e., an example wherein the whole array are divided into x·y/2 groups, each of which has two of the x sub-element groups e<i, j> and each of which is divided into two regions A and B on the basis of "0" or "1" which is a bit value A<k> of a digit number k of a certain address. That is, each of the regions A and B has two elements which correspond to the same address, so that the two elements are simultaneously activated when the address is inputted. In addition, the value of the address A<k> of the elements in the region A is different from that in the region B. Therefore, when the two elements in one of the regions A and B (e.g., region A) are simultaneously activated, the elements in the other region (e.g., region B) are not activated.

Then, a spare element group having n spare elements is prepared for each of the regions A and B of each group (the region of 1/(x·y) of the whole memory array). That is, it is assumed that a repair region corresponding to a certain spare element group having n spare elements is the region A or B in the corresponding group.

According to this preferred embodiment, when an address (A<k>=0 in this case) corresponding to, e.g., the region A, is inputted, the two elements in the regions A of the respective groups are simultaneously activated or replaced with any one of the spare element groups having the corresponding n spare elements. At this time, the elements in the regions B of the respective groups are not activated. Therefore, for each group, only n redundant control circuits, i.e., only n·x/2 redundant control circuits as the whole memory array, are activated. Thus, the electric current consumption of the total of the redundant control circuits can be reduced to half of that of the conventional system.

Furthermore, in this preferred embodiment, the number of the spare elements activated in each of the spare element groups is 1 similar to the first preferred embodiment.

Figure 4:
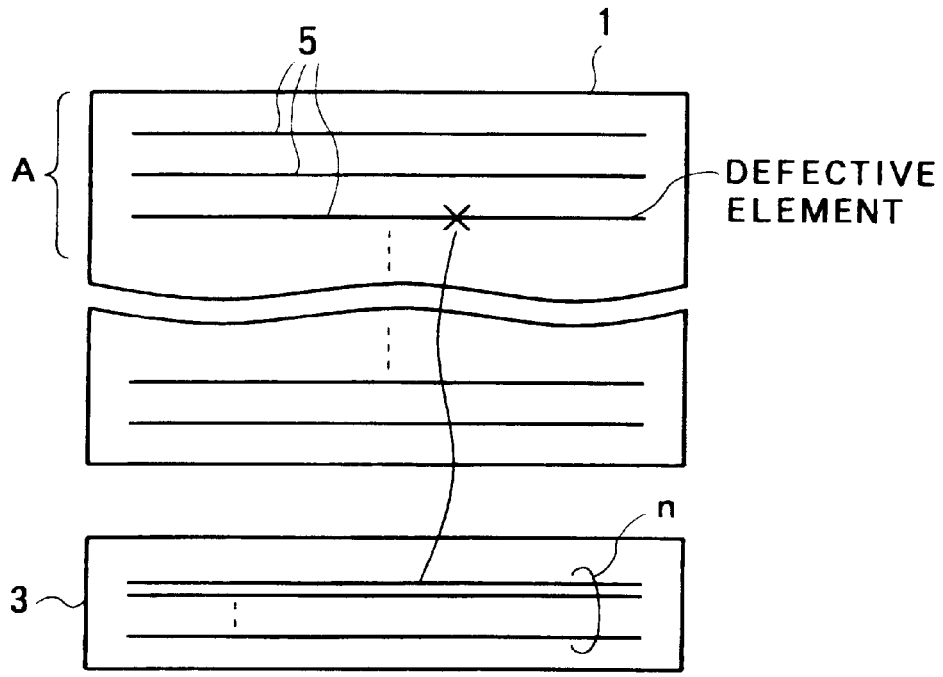
FIG. 4 is a schematic view of the third preferred embodiment of the present invention.

Referring to FIG. 4, the third preferred embodiment of a semiconductor memory device according to the present invention will be described below. This third preferred embodiment relates to the arrangement of the spare element groups in the first or second preferred embodiment.

Now, consider the case where when n spare elements forming a spare element group for each of repair regions are spare word lines, the sources (or drains) of n cell transistors, each of the gates of which is connected to a corresponding one of the n spare word lines, are connected to a certain pair of bit lines. In this case, it is not possible to activate a plurality of spare elements in one of the spare element groups. Therefore, the number of defective elements capable of being simultaneously replaced in the repair region is only one. In addition, in the case where when n spare elements forming a spare element group are spare column selection lines, the sources (or drains) of n column switch transistors, each of the gates of which is connected to a corresponding one of the n spare column selection lines, are connected to a data line or a pair of data lines. In this case, it is not possible to activate a plurality of spare elements in one of the spare element groups. Therefore, the number of defective elements capable of being simultaneously replaced in the repair region is only one.

As such an example, FIG. 4 shows the case where a spare element group 3 comprising a plurality of spare elements is formed as a redundant memory array independent of the memory array. The term "independent" means that the bit lines contained in the spare element group 3 are not connected to the bit lines in the memory array 1 when the elements are word lines and that the data lines connected to the spare element group 3 are independent of the data lines in the memory array 1 when the elements are column selection lines.

In such a case, the number of the spare elements capable of being activated in the redundant array, i.e., the spare element group 3, is only one, and the number of the defective elements capable of being simultaneously replaced in the repair region is also only one.

On the other hand, the case where bit lines or data lines corresponding to a spare element group are in common with bit lines or data lines in the memory array 1 will be described as the fourth preferred embodiment of the present invention. In this fourth preferred embodiment, the relationship between the spare element group and the repair region corresponding thereto may be shown in FIG. 5.

Figure 5:
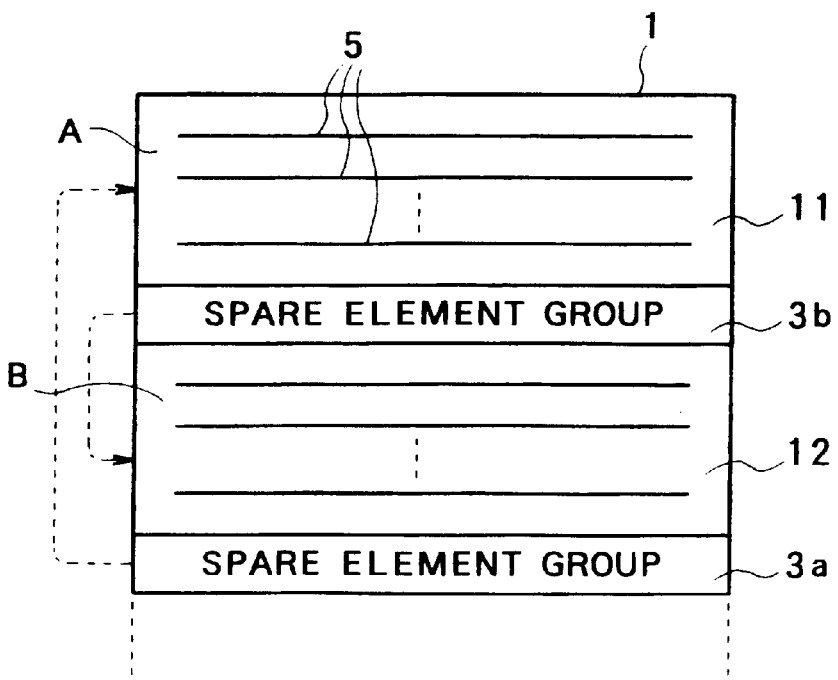
FIG. 5 is a schematic view of the fourth preferred embodiment of the present invention.

As shown in FIG. 5, two regions 11 and 12 in the memory array 1 are considered. It is assumed that a plurality of elements can be simultaneously activated in each of the regions 11 and 12, and it is assumed that the regions 11 and 12 correspond to repair regions A and B repaired by spare element groups, each of which has n spare elements. For example, it is assumed that the elements are word lines. In addition, it is assumed that bit lines in a spare element group 3b adjacent to one region 11 are continuously connected to bit lines in the region 11, and it is assumed that bit lines in a spare element group 3b adjacent to the other region 12 are continuously connected to bit lines in the region 12. In this case, as shown by broken lines in FIG. 5, it is assumed that the one region 11 is a repair region A repaired by the spare element group 3a independent of the region 11, and it is assumed that the other region 12 is a repair region B repaired by the spare element group 3b independent of the region 12.

Also in this preferred embodiment, the number of the elements capable of being simultaneously activated in each of the spare element groups 3a and 3b is only one, and the number of the defective elements capable of being simultaneously replaced in each of the repair regions A and B is also only one.

The concept of the setting of repair regions in the above described preferred embodiments can be generalized as follows. For example, referring to the second preferred embodiment shown in FIG. 2, the elements in each of the element groups E<i> correspond to separate addresses. Therefore, even if the element groups E<i> are divided into y sub-element groups e<i, j> in any ways regardless of address, the number of the elements simultaneously activated in each of the sub-element groups is only one.

Figure 6:
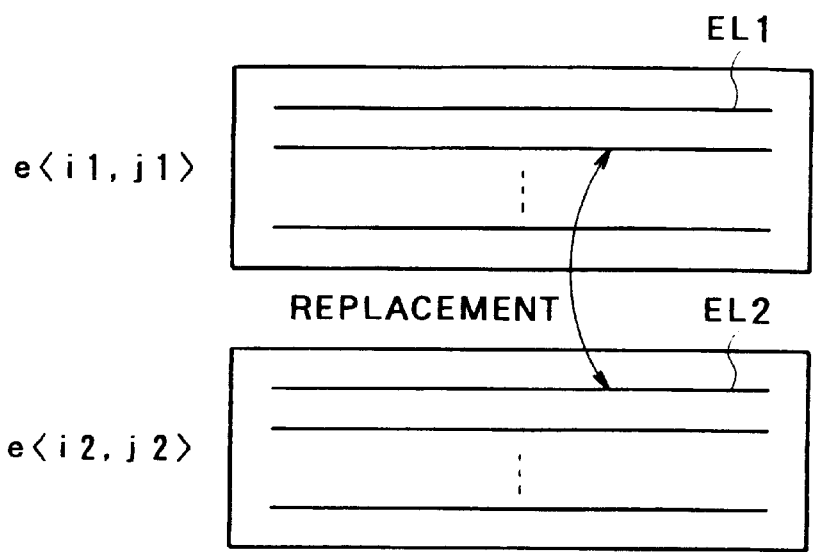
FIG. 6 is a schematic view for explaining a basic concept of the setting of repair regions in the respective preferred embodiments.

Now, as shown in FIG. 6, two elements EL1 and EL2 simultaneously activated when a certain address is inputted are noticed, and it is assumed that the elements EL1 and EL2 belong to sub-element groups e<i1, j1> and e<i2, j2>, respectively. According to the present invention, as shown by arrows in FIG. 6, an element other than the element EL1 belonging to one sub-element group e<i1, j1> is replaced with the element EL2 belonging to the other sub-element group e<i2, j2>, and it is assumed that the regions e<i1, j2> and e<i2, j2> thus replaced are repair regions, to which the spare element groups having n spare elements correspond.

If such setting ol repair regions is carried out, when two elements EL1 and EL2 are simultaneously activated, the number of redundant control circuits, which must be simultaneously enable for the region e<i1, j1>, are only n, and the other redundant control circuits corresponding to the region e<i2, j2> can be disable.

Figure 7:
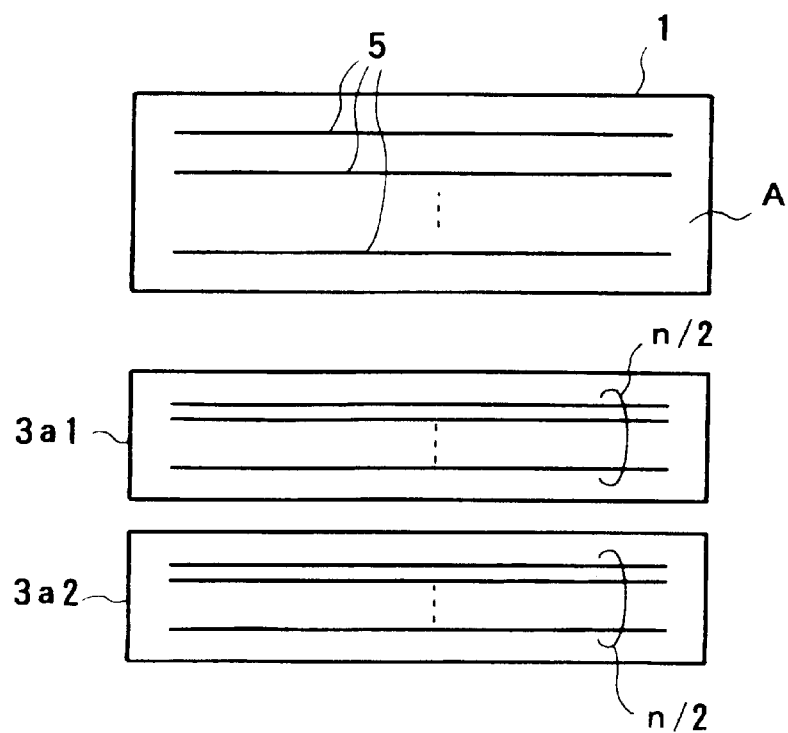
FIG. 7 is a schematic view of the fifth preferred embodiment of the present invention.

Referring to FIG. 7, the fifth preferred embodiment of a semiconductor memory device according to the present invention will be described below. In this semiconductor memory device of the fifth preferred embodiment, a spare element group having n spare elements corresponding to a certain repair region of the memory array 1 comprises a plurality of redundant arrays which are independent of the repair region and of each other. For example, when the elements are word lines, the spare element group having n spare elements for a certain repair region comprises a plurality of arrays having bit numbers independent of each other. In this case, it is possible to simultaneously activate spare word lines, the number of which is the same as the number of separate redundant arrays, so that it is possible to simultaneously replace a plurality of defective elements in the repair region.

When the elements are column selection lines, the spare element group having n spare elements for a certain repair region comprises a plurality of redundant arrays of spare column lines which are independent of the repair region and which have separate corresponding data lines. Also in this case, it is possible to simultaneously activate spare column selection lines, the number of which is the same as the number of the redundant arrays, so that it is possible to replace a plurality of defective elements of the repair region.

FIG. 7 shows the fifth preferred embodiment of the present invention wherein a spare element group 3 having n spare elements necessary for the defect repair in a certain repair region of the memory array 1 is divided into two independent redundant arrays 3a1 and 3a2, each of which has n/2 spare elements. The redundant arrays 3a1 and 3a2 are independent of each other, and one spare element of each of the redundant arrays 3a1 and 3a2 can be simultaneously activated, so that the defects in one repair region A are simultaneously repaired by two spare elements. Furthermore, in this fifth preferred embodiment, while the spare element group 3 has been equally divided into the two redundant arrays 3a1 and 3a2, each having n/2 spare elements, it is not always required to equally divide the spare element group 3.

According to this preferred embodiment, the repair efficiency is higher than the case where spare element groups, each having n spare elements, are arranged as a single array. In addition, it is possible to obtain the same effects as those of the preceding preferred embodiments, which can decrease the number of redundant control circuits, which must be activated, to reduce electric current consumption in comparison with the conventional case where only one element can be activated in the repair region.

The fifth preferred embodiment may be further developed so that a spare element group having n spare elements for a certain repair region is divided into a plurality of sets to be separately arranged in the memory array. This will be described as the sixth preferred embodiment of the present invention.

Figure 8:
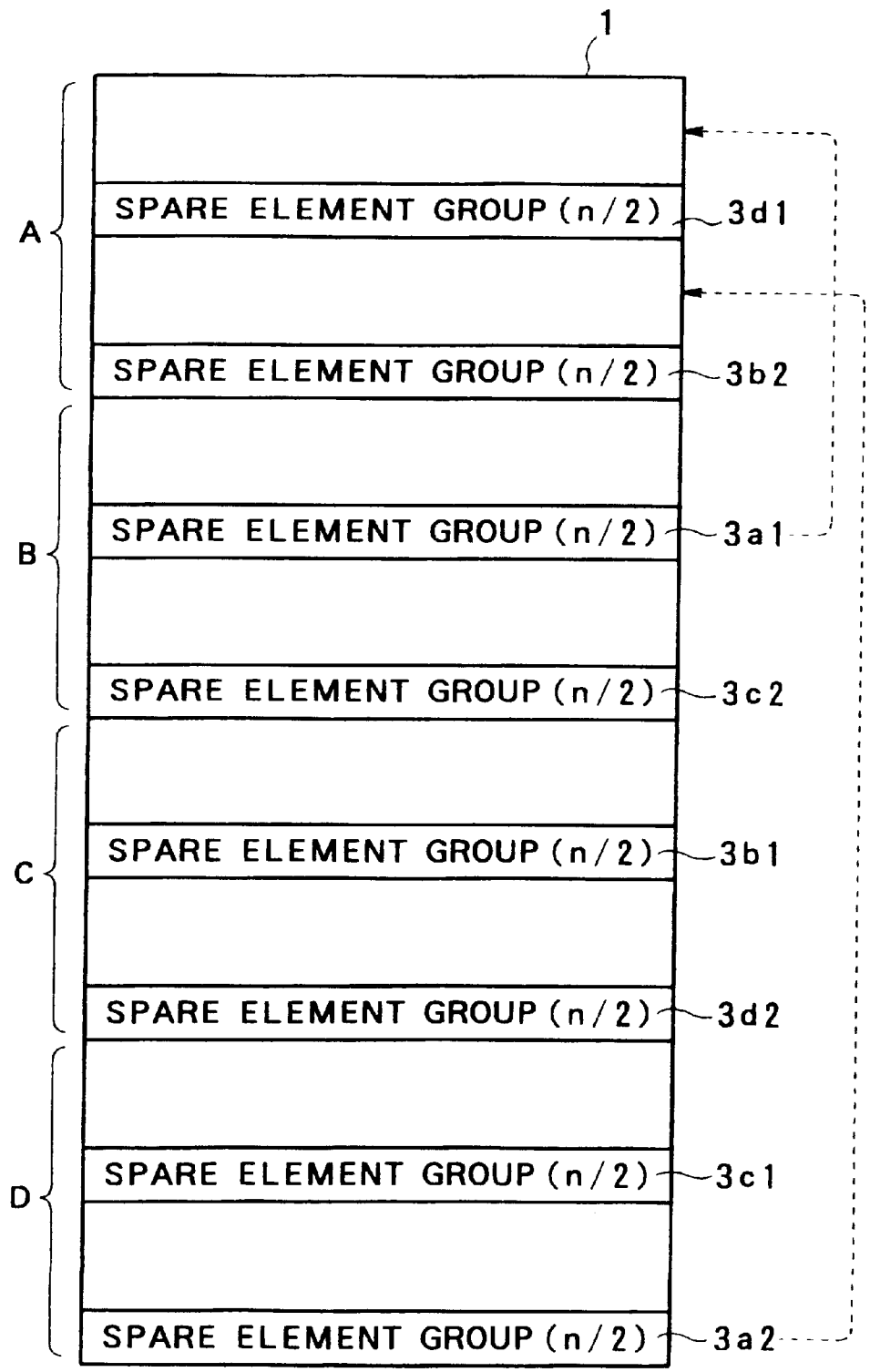
FIG. 8 is a schematic view of the sixth preferred embodiment of the present invention.

FIG. 8 shows the sixth preferred embodiment of the present invention. With respect to each of four repair regions A through D in the memory array 1, the defect repair is carried out by a spare element group having n spare elements. In this case, the spare element groups for the repair region A are separately arranged as spare element groups 3a1 and 3a2, each of which has n/2 spare elements and which are contained in the repair regions B and D, respectively.

The spare element groups for the repair region B are separately arranged in the repair regions C and A as spare element groups 3b1 and 3b2, each having n/2 spare elements. The spare element groups for the repair region C are separately arranged in the repair regions D and B as spare element groups 3c1 and 3c2, each having n/2 spare elements. The spare element groups for the repair region D are separately arranged in the repair regions A and C as spare element groups 3d1 and 3d2, each having n/2 spare elements. That is, the spare element group 3a1, which is contained in the repair region B, of the spare element groups for the repair region A has bit lines (when the elements are word lines) or date lines (the elements are column selection lines) in common with those of a part of a plurality of elements in the repair region B. In addition, the spare elements in the spare element group 3a1 may not have bit lines or data lines in common with each other. The spare element group 3a2 is the same.

It is important that when a plurality of elements in the repair region A are simultaneously activated, the spare element groups 3a1 and 3a2 are arranged so as to belong to a plurality of elements which are not simultaneously activated in the repair regions B and D. In other words, the spare element groups 3a1 and 3a2 have bit lines or data lines in common with a plurality of elements which are not simultaneously activated in the repair regions B and D. Thus, for example, it is possible to prevent data, which are transmitted from the spare elements in the spare element group 3a1, from colliding with data, which are transmitted from the elements in the region B having bit lines or data lines in common with the spare elements in the spare element group 3a1, on the bit lines or data lines. The other spare element groups, each having n/2 spare elements, is the same.

If the spare element groups are thus separately arranged, when, e.g., the repair region A, is noticed, the two spare elements 3a1 and 3a2 corresponding to the repair region A are independent of each other, and the two spare elements 3a1 and 3a2 do not have the bit lines or data lines of the repair region A in common with each other. Therefore, one of the spare elements in one of the spare element groups 3a1 and 3a2 and one of the spare elements in the other spare element group 3a1 or 3a2 (i.e., two of the spare elements in the spare element groups, each having n spare elements) can be simultaneously activated, and two defective elements can be repaired for the repair region A. The other repair regions B, C and D are the same.

In the sixth preferred embodiment shown in FIG. 8, if the spare element group 3d1 for the repair region D, which is contained in the region A, does not have bit lines or data lines in common with the spare element group 3b2 for the repair region B, even if a plurality of elements in the repair region B and a plurality of elements in the repair region D are simultaneously activated, the spare element group 3d1 and the spare element group 3b2 can be used for repairing defects in the regions D and B without limitation, respectively. The spare element groups contained in other regions B, C and D are the same. In addition, in the sixth preferred embodiment shown in FIG. 8, while the spare element group corresponding to a certain repair region has been equally divided into two spare element groups, each having n/2 spare elements, the spare element group may not always be equally divided.

Therefore, according to this preferred embodiment similar to the preceding preferred embodiments, it is possible to improve repair efficiency and to reduce electric power consumption of the redundant control circuits.

Figure 9:
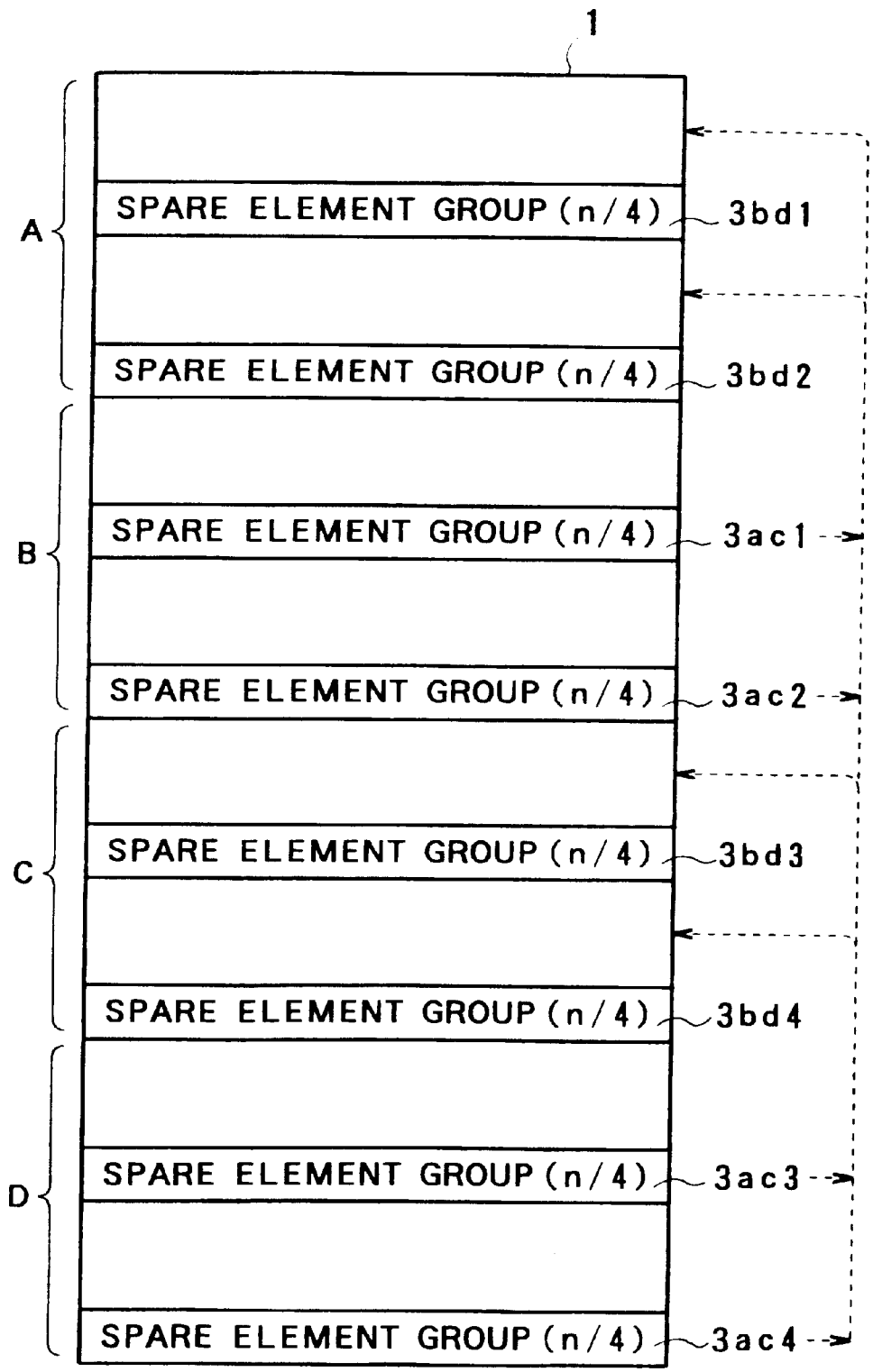
FIG. 9 is a schematic view of a modification of the sixth preferred embodiment of the present invention shown in FIG. 8.

FIG. 9 shows a modification of the preferred embodiment shown in FIG. 8. Spare element groups, each of which has n/4 spare elements, are distributed in the respective repair regions A through D, each of which is covered with n spare elements. In this modification, spare element groups, each of which has n/4 spare elements, cover a plurality of repair regions unlike the case shown in FIG. 8. That is, the spare element groups 3ac1 and 3ac2, each of which comprises n/4 spare elements arranged in the repair region B, and the spare element groups 3ac3 and 3ac4, each of which has n/4 spare elements arranged in the repair region C, are designed to repair defects in the repair regions A and C as shown by broken arrows in FIG. 9. Similarly, the spare element groups 3bd1 and 3bd2, each of which has n/4 spare elements arranged in the repair region A, and the spare element groups 3bd3 and 3bd4, each of which has n/4 spare elements arranged in the repair region C, are designed to repair defects in the repair regions B and D.

According to this modification, four spare elements can be simultaneously activated for each of spare element groups, each of which has n spare elements determined by the size of a repair region, so that four defective element can be simultaneously repaired in the repair region. Therefore, it is possible to more improve repair efficiency. It is also possible to reduce the number of spare elements in the whole memory array. In addition, if, e.g., two repair regions A and C, are simultaneously activated, the number of the redundant control circuits to be activated may be n, so that the number of the redundant control circuits to be activated can be reduced to half.

Furthermore, in the layout of the modification shown in FIG. 9, for example, the spare element groups 3bd1 and 3bd2 in the repair region A can be used for repairing defects in the repair region A. For example, if the spare element groups 3bd2 and 3bd1, which are contained in the repair region A and which correspond to other repair regions B and D, include spare elements which do not have bit lines or data lines in common with the elements simultaneously activated in the repair region A, it is possible to replace the simultaneously activated elements with the spare elements. In addition, if there are spare elements which have bit lines or data lines in common with the elements simultaneously activated in the repair region A, even if defective elements having bit lines or data lines in common with each other are repaired by the spare elements, no collision occurs on the bit lines or data lines.

According to such a system, it is possible to increase the number of spare elements for repair regions, so that it is possible to greatly improve repair efficiency.

The seventh preferred embodiment of the present invention will be described below. In this seventh preferred embodiment, there is provided a semiconductor memory device having a plurality of operation modes wherein the number of elements simultaneously activated in a memory array is different in each operation mode. In an operation mode wherein the number of elements simultaneously activated is large, a plurality of elements are simultaneously activated in each of repair regions, and elements are simultaneously activated in a plurality of repair regions.

In an operation mode wherein the number of elements simultaneously activated is small, repair regions are set so as to reduce the number of repair regions wherein elements are simultaneously activated.

For example, this preferred embodiment can be used for increasing the number of word lines, which are activated only during a refresh operation, so that the retention time (data holding time) of a memory cell may be short. The increase of the number of activated elements is the same as the decrease of the number of bits of an internal address for selecting elements.

Figure 10:
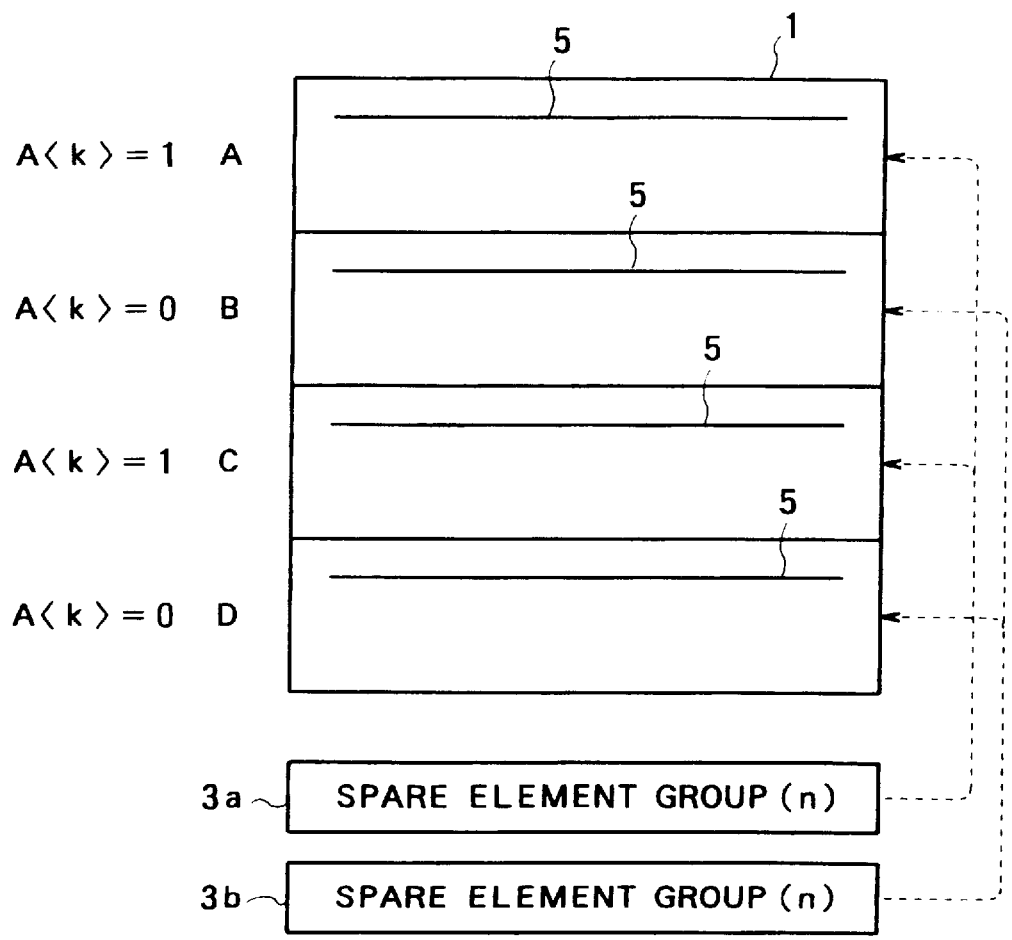
FIG. 10 is a schematic view of the seventh preferred embodiment of the present invention.

FIG. 10 shows the seventh preferred embodiment of the present invention. It is assumed that, in an activating mode wherein the number of bits of an internal address is small, four elements 5 are simultaneously activated in the whole memory array 1, and n spare element groups 3a and n spare element groups 3b are prepared for a repair region of a half area of the whole memory array 1. The memory array 1 is divided into four regions A, B, C and D so that all of elements can be identified by addresses in the respective regions. In this case, as shown by broken lines in FIG. 10, it is important that the repair regions covered with the respective spare element groups 3a and 3b are regions (A+C) and (B+D), respectively.

In other activation modes wherein the number of bits of an internal address is large, it is assumed that an address A<k> increases as shown in FIG. 10, so that the regions A and C are selected at A<k>=1 and the regions B and D are selected at A<k>=0. In this case, one element in the region A and one element in the region C, or one element in the region B and one element in the region D are simultaneously activated in the memory array 1.

Therefore, as described above, if the repair region repaired by the spare element group 3a is set to be the region (A+C) and if the repair region repaired by the spare element group 3b is set to be the region (B+D), the number of the repair regions simultaneously activated is reduced to half in an activation mode wherein the number of bits of an internal address is large, so that it is possible to reduce the number of enable redundant control circuits. Such effects can not be obtained if the repair regions repaired by the spare element groups 3a and 3b are set to be regions (A+B) and (C+D).

As shown in FIG. 10, when two elements are simultaneously activated in a repair region in an activation mode wherein the number of bits of an internal address is small, if the elements are defective, any one of the two elements must be selectively replaced. Therefore, the redundant control circuit corresponding to each of the spare elements must comprise a plurality of address fuses (except for a fuse corresponding to A<k>) and a special fuse for determining which of the two elements is replaced regardless of an input address. If the repair regions are set to be the regions (A+B) and (C+D), when the number of bits of an internal address increases, a complicated control must be carried out so as not to erroneously activate spare elements. For example, consider the case where it is programmed by the special fuse and address fuse that an element 5 in a region B is replaced with a certain spare element and that an element in a region A is activated at A<k>=1. In this case, even if an address programmed by the address fuse is inputted to the corresponding redundant control circuit, the spare element can not be activated. In order to activate the spare element, a complicated control for comparing the information on the special fuse with the address A<k> somewhere in the redundant control circuit must be carried out.

On the other hand, if the repair region is set by the combination of the regions (A+C) and (B+D) as the seventh preferred embodiment, it is not required to compare the information on the special fuse with the address A<k> even if the number of internal address bits increases. In addition, if considering the case where an address (A<k>=1) corresponding to the region (A+C) is inputted assuming that a certain spare element corresponds to the repair region (B+D), even if an address programmed by the address fuse is inputted to the corresponding redundant control circuit, the redundant control circuit corresponding to the spare element is inactivated by the value of A<k>, so that the spare element is not erroneously activated.

Figure 11:
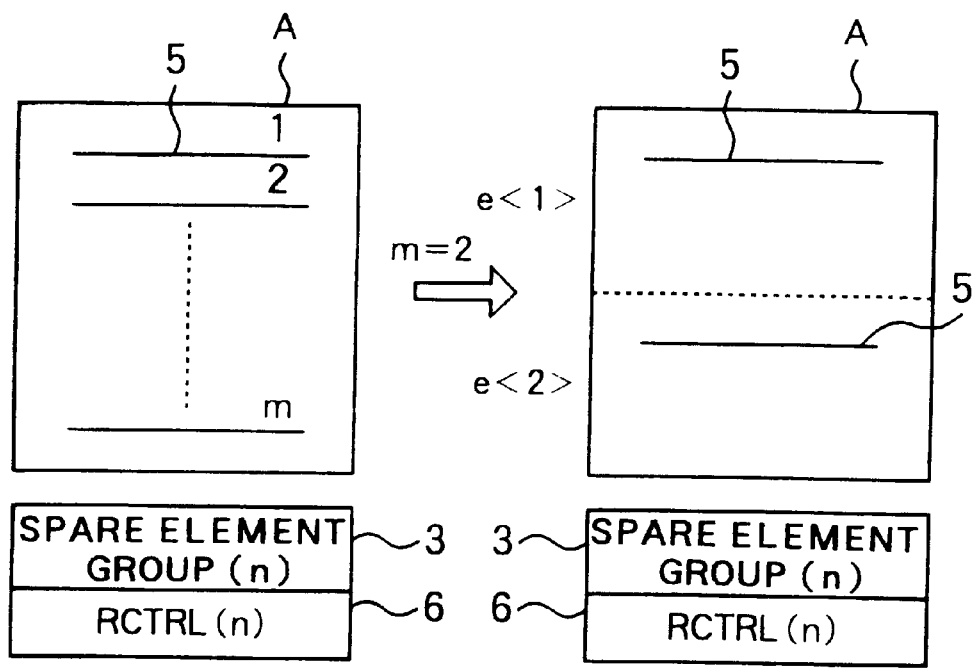
FIG. 11 is a schematic view for explaining the control of replacement of elements, which are simultaneously activated in a repair region, using a redundant control circuit.

Referring to FIG. 11, how to control a plurality (m) of elements 5, which are simultaneously activated in a repair region A, by a control part 6 for a spare element group 3 having n spare elements corresponding to the repair region A, will be described below. For simple explanation, the case where m=2 will be described.

As shown in FIG. 11, the fact that m elements 5 are simultaneously activated in the repair region A means that the m elements 5 are not identified by an input address (e.g., A<1>~A<1>). It is also conceived that the whole repair region A comprises regions e<i>including elements corresponding to all combinations of addresses.

Figure 12:
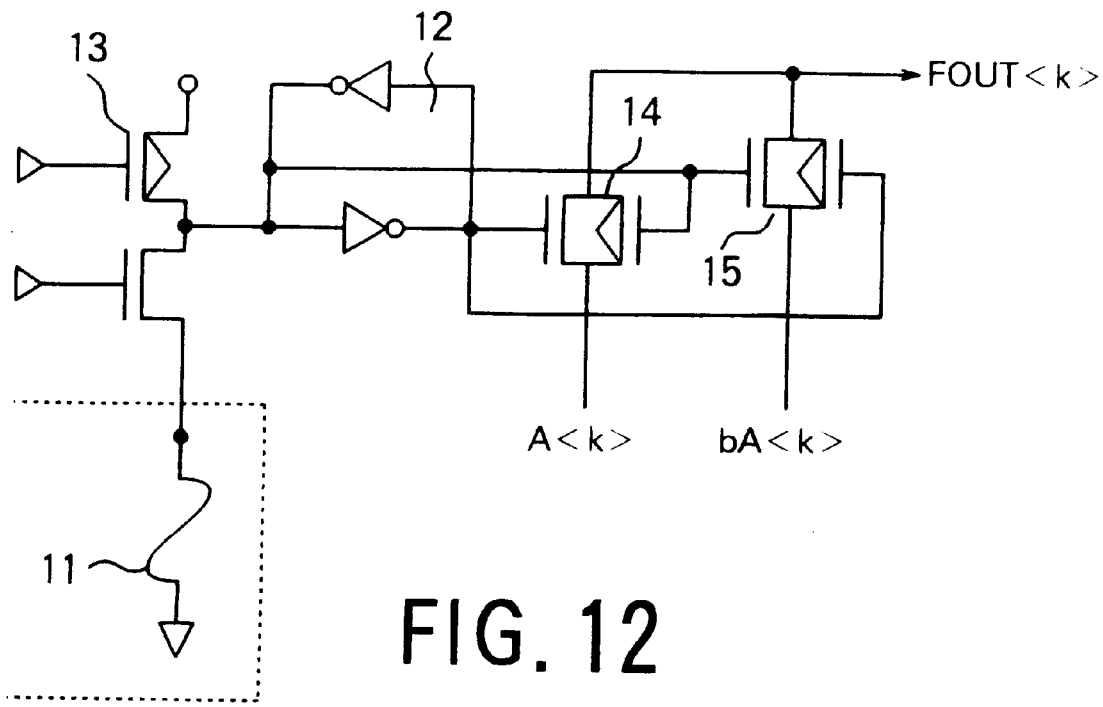
FIG. 12 is a diagram showing a fuse circuit and a fuse latch circuit for programming a defective address in a redundant control circuit.
Figure 13:
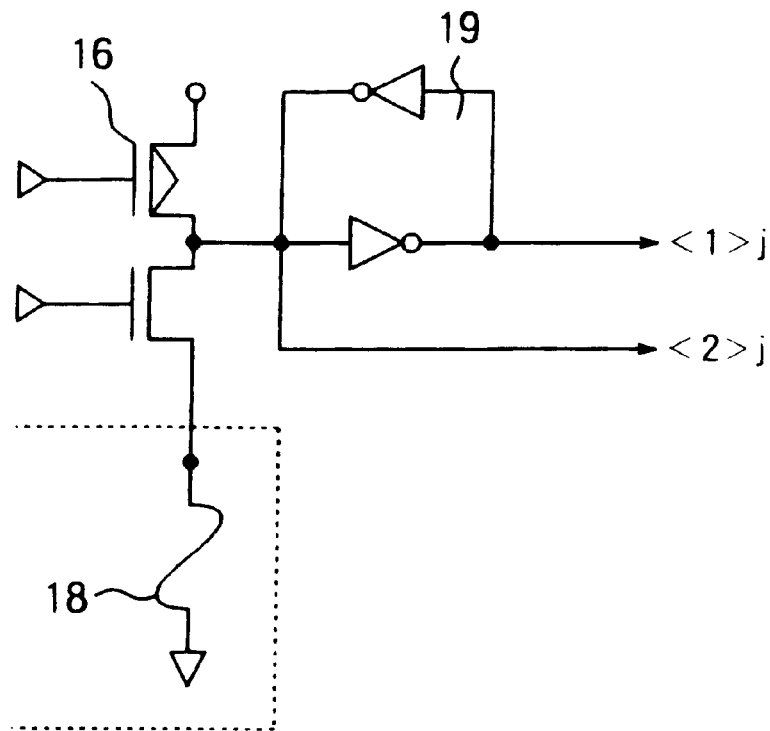
FIG. 13 is a diagram showing a special fuse circuit and a fuse latch circuit in the redundant control circuit.

Each of the control parts 6 is provided so as to correspond to each of the spare element groups 3, each of which has n spare elements. Each of the control parts 6 has n redundant control circuits corresponding to n spare elements contained in the corresponding spare element group. Each of the redundant control circuits includes: a fuse circuit for programming a defective address to be replaced; a fuse data latch circuit corresponding to each of the fuses; and a comparing circuit. Each of the n spare elements can be replaced with any one of elements in the repair region A. Therefore, as shown in FIG. 12, the redundant control circuit has an address fuse 11 for each of bits of an address, and a fuse data latch circuit 12 corresponding thereto, in order to program which element is replaced in the respective region e<i>. In addition, as shown in FIG. 13, the redundant control circuit has $q(\log_2(m-1)<q\leq\log_2 m)$ special fuses 18 unrelated to an address for programming which of two regions e<1> and e<2> an element is replaced, and a fuse data latch circuit 19 corresponding thereto. FIGS. 12 and 13 include initialing circuits 13 and 16, respectively.

Figure 14:
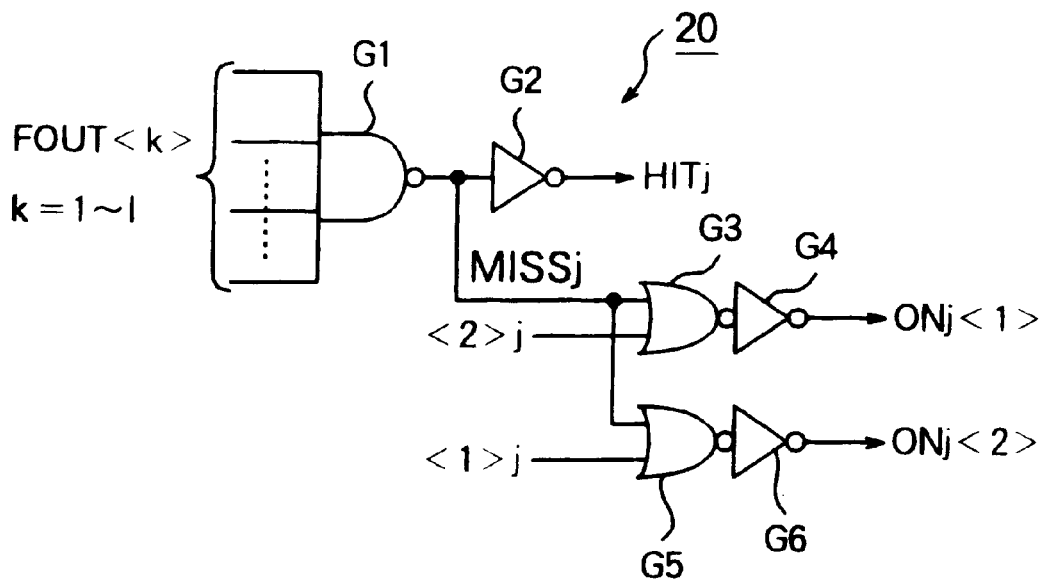
FIG. 14 is a diagram showing a comparing circuit in the redundant control circuit.

To the fuse latch circuit 12 of the address fuse shown in FIG. 12, complementary address signals A<k> and bA<k> are inputted via an address bus. Any one of transfer gates 14 and 15 is turned on in accordance with the fuse state to output any one of the address signals A<k> and bA<k> as a signal FOUT<k>. When a programmed address is inputted to the address fuse, the signals FOUT<k> for all addresses of k=1~i are "H" in the comparing circuit 20 shown in FIG. 14. This means that the coincidence of these addresses with each other is detected by a NAND gate. Then, an inverter G2 outputs a signal HITj which represents the coincidence (HIT) in the comparison, i.e., which represents that the replacement of elements should be carried out. When the addresses are not coincident with each other, the NAND gate G1 outputs a signal MISSj indicative of the mismatch of addresses (MISS). The difference between the system of the present invention for simultaneously activating elements in a repair region and a conventional system for activating only one element in a repair region is that even if the addresses are coincident with each other to activate a spare element so that an element replaced with the spare element is inactive, other elements must be activated unless the other elements are replaced with spare elements. Therefore, as shown in FIG. 14, the comparing circuit 20 has m systems of outputs ONj<i> corresponding to m (=2) elements simultaneously activated in a repair region. The fact that the ONj<i> is "H" means that an element in a region e<i> is not replaced with a spare element corresponding to a redundant control circuit RCTRL$_j$. Then, as shown in FIG. 14, signals ENABLE<i> for activating elements in regions e<i> are generated by the AND logic of outputs ONj<i> of n comparing circuits, and an element corresponding to an input address in the regions e<i> is activated. Furthermore, the comparing circuit 20 may have m systems of HITj<i> (i=1~m), and signals ENABLE<i> may be inactivated by the OR logic of n HITj<i> (j=1~n).

The outputs <1>j and <2>j of the fuse latch circuit 19 of the special fuse shown in FIG. 13 are determined in accordance with the fuse state when power is ON. These outputs enter the NOR gates G3 and G5 of the comparing circuit 20 with signals MISSj. Therefore, any one of the outputs ONj<1> and ONj<2> is "H" before the signal MISSj is generated.

Thus, even if an input address is coincident with an address programmed in a redundant control circuit to output no signal MISSj (i.e., even if a defective address is replaced with a spare element), an ONj<i> for a region e<i> which is not replaced with the spare element is in the "H" state, so that the element in the region e<i> can be activated unless the element in the region e<i> is replaced with another spare element. Therefore, the m elements to be simultaneously activated can be independently replaced with spare elements or can not be replaced with spare elements.

Figure 15:
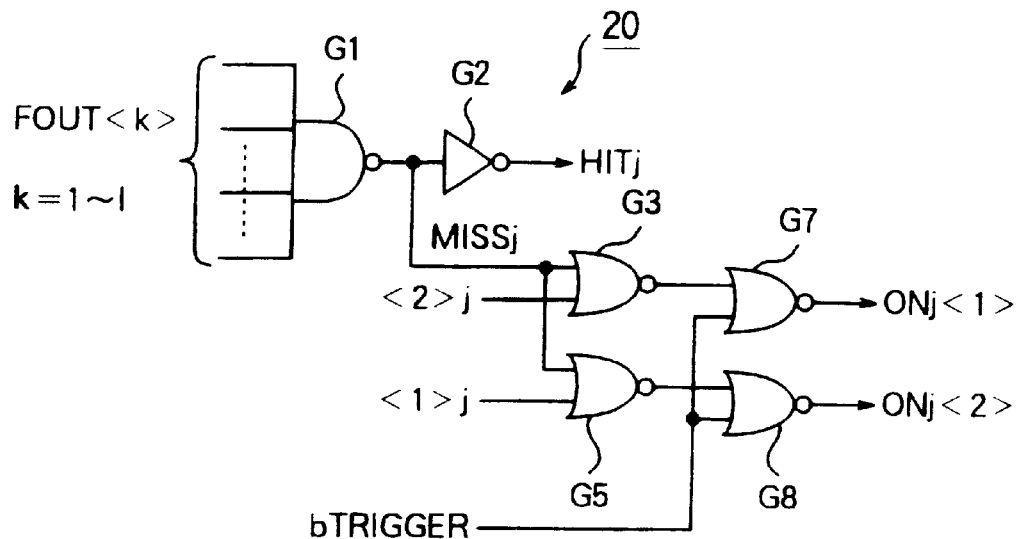
FIG. 15 is a diagram showing another example of a comparing circuit in the redundant control circuit.

However, in the system shown in FIG. 14, when the address are not coincident with each other (MISS), any one of the outputs ONj<1> and ONj<2> is late generated to stagger the activation timing for m elements simultaneously activated. In order to solve this problem, for example as shown in FIG. 15, a trigger signal bTRIGGER, which is generated after the comparison using the comparing circuit is completed and which is an output of a built-in timer circuit or like, may be utilized, and NOR gates G7 and G8 may be provided for obtaining the OR logic between the outputs of the NOR gates G3, G5 and the trigger signal bTRIGGER to generate an output ONj.

When it is programmed that a defective element in a region e<1>shown in FIG. 11 is replaced with a spare element to be noticed, the output <1>j of the circuit shown in FIG. 13 is in the "H" state in direct current. Therefore, even if the spare element is HIT to generate no signal MISSj, if the trigger signal bTRIGGER is "L", a signal ONj<2> is generated. Of course, if the signal MISSj is generated, both of the outputs ONj<1> and ONj<2> are generated.

There is also a method for generating such a trigger signal bTRIGGER without the need of any built-in timer circuits (delay circuits) to cause the activation timings of m elements to coincide with each other. For example, there is a method for allowing both of complementary address signals A<k> and bA<k> to be "H" in the initial state. Thus, in FIG. 15, all of signals FOUTj<k> inputted to a NAND gate G1 are "H" in the initial state, so that the initial state of a comparing circuit 20 is the coincidence detection (HIT) state. Thus, a signal MISSj is generated only after an address is transferred, so that any one of the outputs ONj<1> and ONj<2> is not generated unless the comparison is completed.

Figure 16:
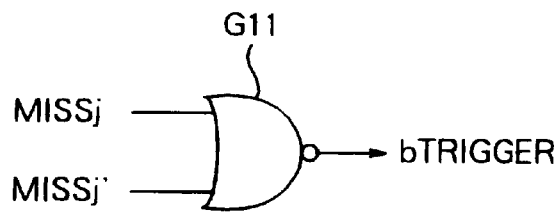
FIG. 16 is a diagram showing a trigger signal generating circuit in the redundant control circuit.

FIG. 16 shows a circuit for generating a trigger signal bTRIGGER without the need of any built-in timers (delay circuits). As shown in FIG. 16, a NOR gate G11 derives the OR logic of a signal MISSj, which is generated from a comparing circuit to be noticed, and a signal MISSj', which is generated from a comparing circuit corresponding to a spare element, which is not activated simultaneously with the spare element corresponding to the comparing circuit to be noticed, to generate a trigger signal bTRIGGER. Thus, even if the signal MISSj is not generated due to its own HIT, the trigger signal bTRIGGER can be generated by the signal MISSj'. Also when both of signals ONj<1> and ONj<2> are generated by the generation of the signal MISSj, both of these outputs are simultaneously generated in response to the trigger signal bTRIGGER, so that the activation timings of m (2 in this case) elements are coincident with each other.

By generating such a trigger signal, the transition of address always occurs without the need of any built-in timer circuits or the like for monitoring the termination of comparison, so that it is possible to generate a signal ONj<i> after the comparison operation in the comparing circuit. Therefore, it is possible to prevent defective elements from being erroneously activated. In addition, the trigger signal must be usually generated so as to leave a margin in view of the fluctuation in termination timing of comparison due to the fluctuation in process, address skew and so forth. Since the system shown in FIG. 16 does not include such an intentional delay, the element activating rate can be increased.

Figure 17:
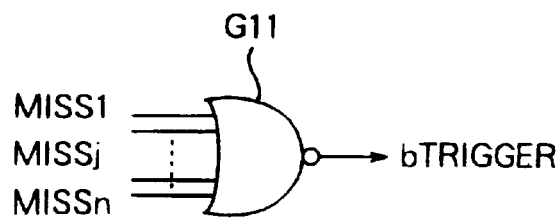
FIG. 17 is a diagram showing another example of a trigger signal generating circuit in the redundant control circuit.

The trigger signal generating system shown in FIG. 16 has used a signal MISSj' generated from a comparing circuit corresponding to a spare element, which is not activated simultaneously with a spare element, to which a comparing circuit to be noticed corresponds. FIG. 17 shows another example of a trigger signal generating circuit.

When the number m of elements simultaneously activated in a repair region is greater than the number n of spare elements, even if all of the elements simultaneously activated are replaced with the spare elements, a redundant control circuit for detecting a mismatch (MISS) remains existing. Therefore, as shown in FIG. 17, if all of signals MISSj (j=1~n) including signals MISSj outputted from its own comparing circuit are inputted to a NOR gate G11, a desired trigger signal bTRIGGER can be obtained. In addition, even if m≧n, when the number of spare elements capable of being simultaneously activated is limited and when the number of redundant control circuits capable of being programmed in the same defective address is limited, a redundant control circuit for detecting MISS always exists, so that the system shown in FIG. 17 is effective.

Figure 18:
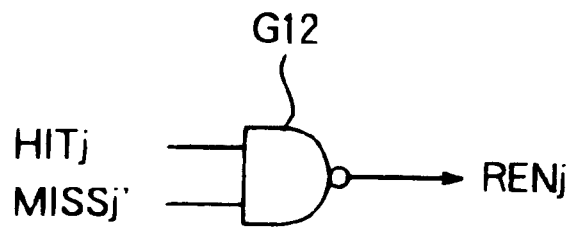
FIG. 18 is a diagram showing a spare element activating signal generating circuit in the redundant control circuit.

FIG. 18 shows an example of a circuit for generating a spare element activating signal RENj. In the comparing circuit 20 shown in FIG. 15, in the system for allowing both of complementary address signals A<k> and bA<k> to be "H" in the initial state, a coincidence detection signal HITj is "H" in the initial state, so that it is unclear when the HITj is established when the comparing circuit 20 detects coincidence. Therefore, similar to the case shown in FIG. 16, a signal MISSj indicative of the termination of comparison and the HITj are inputted to a NAND gate G12 to derive an AND logic. Thus, it is possible to generate a spare element activating signal RENj after the termination of comparison.

Figure 19:
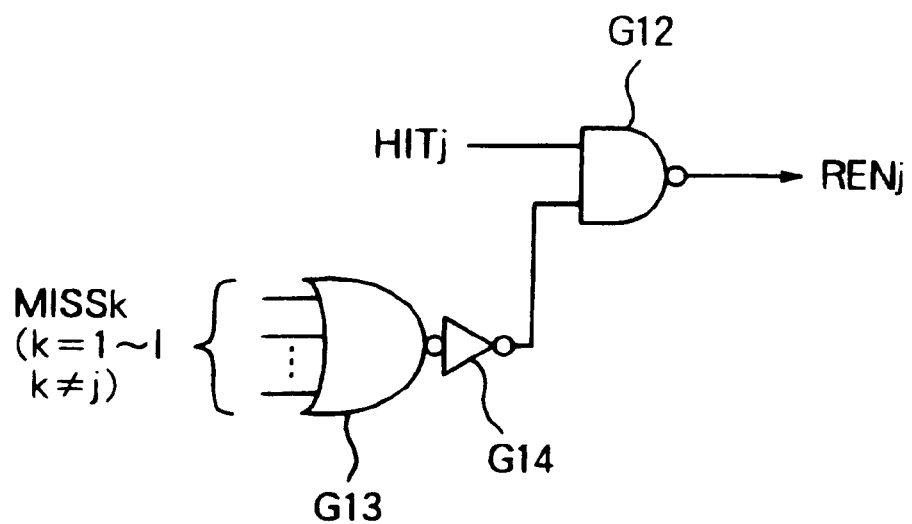
FIG. 19 is a diagram showing anther example of a spare element activating signal generating circuit in the redundant control circuit.
Figure 20:
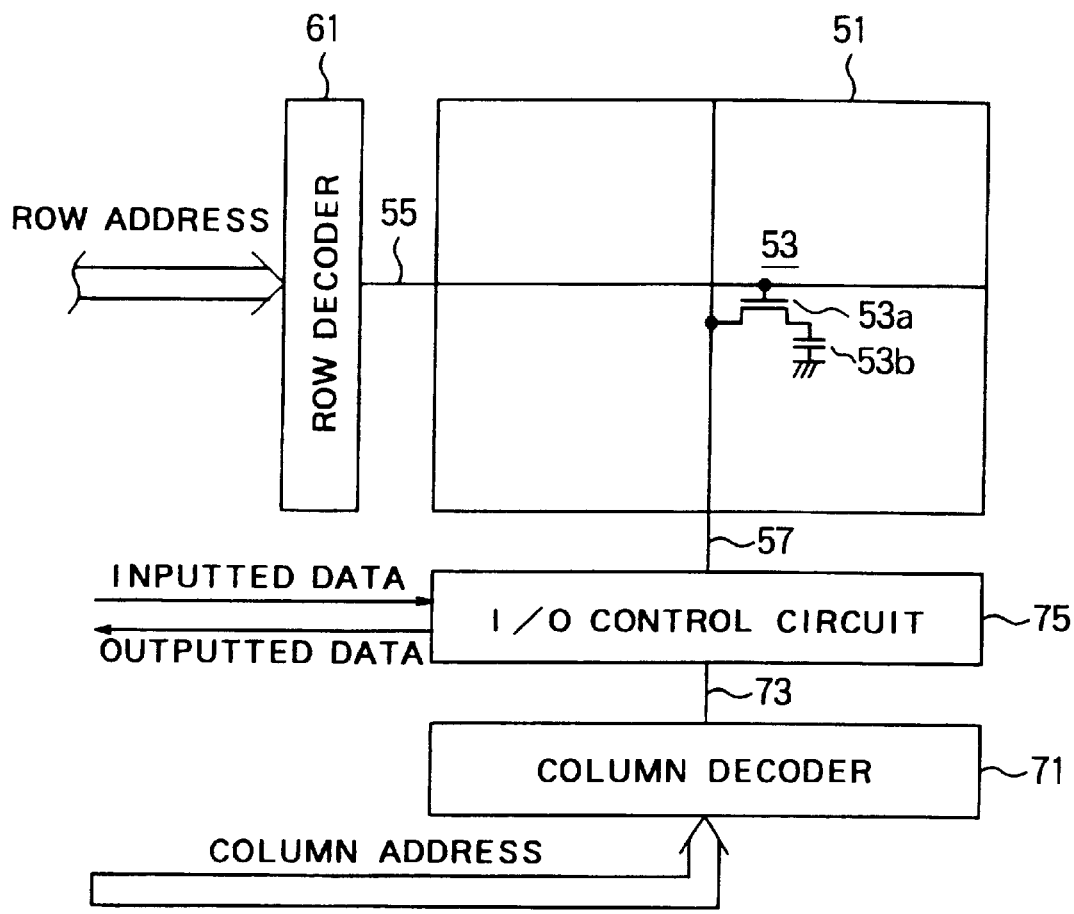
FIG. 20 is a block diagram showing a DRAM.

FIG. 19 shows another spare element activating signal generating circuit. In this signal generating circuit, signals MISSk (k=1~n, except for k=j) other than a signal MISSj generated from itself are inputted to a NOR gate G13, the output of which is inverted by an inverter G14, and the coincidence of the inverted output with a signal HITj is detected by a NAND gate G12. Also by this circuit, it is possible to generate a spare element activating signal RENj after the termination of comparison.

As described above, according to the present invention, in a semiconductor memory device adopting a redundant circuit system, a repair region in a memory array to be repaired by a spare element group for replacing a defective element is set so that a plurality of elements in the repair region can be simultaneously activated. Thus, it is possible to effectively reduce electric power consumption in the total of redundant circuits.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:
    a memory array having a plurality of memory cells arranged in the form of an array, and a plurality of elements, each of which selects a predetermined number of memory cells from said plurality of memory cells, x elements (x is an integer of 2 or more) of said plurality of elements being simultaneously activated, and said memory array being divided into a plurality of repair regions, each of which has at least two of said elements;
    a plurality of spare element groups, each of which is provided so as to correspond to a corresponding one of said repair regions, each of said spare element groups having a plurality of spare memory cells and a predetermined number of spare elements, each of said spare elements selecting a predetermined number of spare memory cells from said spare memory cells to replace a defective element in a corresponding one of said repair regions;
    a plurality of redundant control circuits, each of which is coupled to a corresponding one of said spare elements in a corresponding one of said spare element groups; and
    a plurality of control parts, each of which is coupled to a corresponding one of said spare element groups, each of said control parts controlling the replacement of one of said spare elements m said corresponding one of said spare element groups for a defective element on the basis of at least an output of said redundant control circuits corresponding to said one of said spare elements in said corresponding one of said spare element groups,
    wherein the number of said repair regions is x·y assuming that a ratio of a memory capacity of a region of said memory array per one of elements simultaneously activated in said memory array to a memory capacity of one of said repair regions corresponding to one of said spare element groups is y (y is an integer of 1 or more),
    each of said repair regions being designed so that a plurality of said elements are simultaneously activated therein, and
    each of said spare element groups being designed so that the number of said spare elements simultaneously activated therein is one.

2. A semiconductor memory device as set forth in claim 1, wherein said memory array is divided into x element groups, each of which has at least one element, each of said element groups being designed so that each of said elements contained in each of said element groups is identified by an address, and
    wherein assuming that $x = r \cdot 2^p$ and $m-1 < \log_2 y \leq m$ (p and m are positive integers), each of said element groups is divided into y sub-element groups on the basis of the difference in address of m bits, and x sub-element groups corresponding to the same address being divided into groups, each of which includes $2^p$ sub-element groups, each of said groups being divided into $2^p$ regions on the basis of the difference in address of p bits, each of said regions being set as a corresponding one of said repair regions for a corresponding one of said spare element groups.

3. A semiconductor memory device as set forth in claim 2, wherein each of said spare element groups provided so as to correspond to said corresponding one of said repair regions is arranged as a redundant array independent of said memory array.

4. A semiconductor memory device as set forth in claim 2, wherein one of said spare element groups corresponding to one of said repair regions is arranged so as to belong to another of said repair regions in said memory array.

5. A semiconductor memory device as set forth in claim 1, wherein each of said spare element groups provided so as to correspond to said corresponding one of said repair regions is arranged as a redundant array independent of said memory array.

6. A semiconductor memory device as set forth in claim 1, wherein one of said spare element groups corresponding to one of said repair regions is arranged so as to belong to another of said repair regions in said memory array.

7. A semiconductor memory device as set forth in claim 1, wherein assuming that the number of said elements simultaneously activated in each of said repair regions is m ($\geq 2$), each of said repair regions is divided into m sub-regions so that the number of said elements simultaneously activated in each of said sub-regions is one, each of said redundant control circuits comprising:
    a sub-region determining circuit for determining one of said m sub-regions in which a defective element is capable of being replaced with one of said spare elements corresponding to a corresponding one of said redundant control circuits;
    an address storage circuit for programmably storing an address of said defective element;
    a comparing circuit for comparing an input address with an address stored in said address storage circuit to output a coincidence signal when said input address is coincident with said stored address, and to output a mismatch signal when said input address is not coincident with said stored address;
    a trigger signal generating circuit for generating a trigger signal on the basis of said mismatch signal outputted from said comparing circuit and a mismatch signal generated from another comparing circuit in another redundant control circuit corresponding to another spare element, which belongs to one of said spare element groups and is not activated simultaneously with a spare element corresponding to said redundant control circuit; and
    a non-replacement command signal generating circuit for generating m non-replacement command signals for commanding whether said spare element is replaced for each of said m sub-regions, on the basis of said trigger signal outputted from said trigger signal generating circuit, said mismatch signal outputted from said comparing circuit, and an output of said sub-region determining circuit.

8. A semiconductor memory device comprising:
    a memory array having a plurality of memory cells arranged in the form of an array, and a plurality of elements, each of which selects a predetermined number of memory cells from said plurality of memory cells, said memory array being divided into a plurality of repair regions, each of which has at least two of said elements;

a plurality of spare element groups, each of which is provided so as to correspond to a corresponding one of said repair regions, each of said spare element groups having a plurality of spare memory cells, and a predetermined number of spare elements, each of said spare elements selecting a predetermined number of spare memory cells from said spare memory cells to replace a defective element in a corresponding one of said repair regions;

a plurality of redundant control circuits, each of which is coupled to a corresponding one of said spare elements in a corresponding one of said spare element groups; and a plurality of control parts, each of which is coupled to a corresponding one of said spare element groups, each of said control parts controlling the replacement of one of said spare elements in said corresponding one of said spare element groups for a defective element on the basis of at least an output of said redundant control circuits corresponding to said one of said spare elements in said corresponding one of said spare element groups, wherein each of said plurality of spare element groups is independent of said memory array and divided into a plurality of redundant arrays independent of each other, each of said repair regions being set so that a plurality of said elements are simultaneously activated therein.

9. A semiconductor memory device as set forth in claim 8, wherein assuming that the number of said elements simultaneously activated in each of said repair regions is m ($\geq 2$), each of said repair regions is divided into m sub-regions so that the number of said elements simultaneously activated in each of said sub-regions is one, each of said redundant control circuits comprising:

a sub-region determining circuit for determining one of said m sub-regions in which a defective element is capable of being replaced with one of said spare elements corresponding to a corresponding one of said redundant control circuits;

an address storage circuit for programmably storing an address of said defective element;

a comparing circuit for comparing an input address with an address stored in said address storage circuit to output a coincidence signal when said input address is coincident with said stored address, and to output a mismatch signal when said input address is not coincident with said stored address;

a trigger signal generating circuit for generating a trigger signal on the basis of said mismatch signal outputted from said comparing circuit and a mismatch signal generated from another comparing circuit in another redundant control circuit corresponding to another spare element, which belongs to one of said spare element groups and is not activated simultaneously with a spare element corresponding to said redundant control circuit; and a non-replacement command signal generating circuit for generating m non-replacement command signals for commanding whether said spare element is replaced for each of said m sub-regions, on the basis of said trigger signal outputted from said trigger signal generating circuit, said mismatch signal outputted from said comparing circuit, and an output of said sub-region determining circuit.

10. A semiconductor memory device comprising:

a memory array having a plurality of memory cells arranged in the form of an array, and a plurality of elements, each of which selects a predetermined number of memory cells from said plurality of memory cells, said memory array being divided into a plurality of repair regions, each of which has at least two of said elements;

a plurality of spare element groups, each of which is provided so as to correspond to a corresponding one of said repair regions, each of said spare element groups having a plurality of spare memory cells, and a predetermined number of spare elements, each of said spare elements selecting a predetermined number of spare memory cells from said spare memory cells to replace a defective element in a corresponding one of said repair regions;

a plurality of redundant control circuits, each of which is coupled to a corresponding one of said spare elements in a corresponding one of said spare element groups; and a plurality of control parts, each of which is coupled to a corresponding one of said spare element groups, each of said control parts controlling the replacement of one of said spare elements in said corresponding one of said spare element groups for a defective element on the basis of at least an output of said redundant control circuits corresponding to said one of said spare elements in said corresponding one of said spare element groups, wherein each of said repair regions being set so that a plurality of said elements are simultaneously activated therein, each of said spare element groups being arranged in a plurality of repair regions, each of which is different from said corresponding one of said repair regions and each of which includes an element which is not activated simultaneously with one of said elements in said corresponding one of said repair regions.

11. A semiconductor memory device as set forth in claim 10, wherein a defective element in each of said repair regions is capable of being replaced with one of said spare elements m one of said spare element groups which are separately arranged in one of said repair regions including said defective element, said one of said spare element groups corresponding to one of said other repair regions.

12. A semiconductor memory device as set forth in claim 10, wherein said spare element groups are arranged so that said spare elements in each of said spare element groups are capable of repairing defective elements in a plurality of repair regions.

13. A semiconductor memory device as set forth in claim 10, wherein assuming that the number of said elements simultaneously activated in each of said repair regions is m ($\geq 2$), each of said repair regions is divided into m sub-regions so that the number of said elements simultaneously activated in each of said sub-regions is one, each of said redundant control circuits comprising:

a sub-region determining circuit for determining one of said m sub-regions in which a defective element is capable of being replaced with one of said spare elements corresponding to a corresponding one of said redundant control circuits;

an address storage circuit for programmably storing an address of said defective element;

a comparing circuit for comparing an input address with an address stored in said address storage circuit to output a coincidence signal when said input address is coincident with said stored address, and to output a mismatch signal when said input address is not coincident with said stored address;

a trigger signal generating circuit for generating a trigger signal on the basis of said mismatch signal outputted from said comparing circuit and a mismatch signal generated from another comparing circuit in another redundant control circuit corresponding to another spare element, which belongs to one of said spare element groups and is not activated simultaneously with a spare element corresponding to said redundant control circuit; and a non-replacement command signal generating circuit for generating m non-replacement command signals for commanding whether said spare element is replaced for each of said m sub-regions, on the basis of said tiger signal outputted from said trigger signal generating circuit, said mismatch signal outputted from said comparing circuit, and an output of said sub-region determining circuit.

14. A semiconductor memory device comprising:

a memory array having a plurality of memory cells arranged in the form of an array, and a plurality of elements, each of which selects a predetermined number of memory cells from said plurality of memory cells, said memory array being divided into a plurality of repair regions, each of which has at least two of said elements, and said memory array having a plurality of operation modes which have different numbers of said elements simultaneously activated;

a plurality of spare element groups, each of which is provided so as to correspond to a corresponding one of said repair regions, each of said spare element groups having a plurality of spare memory cells, and a predetermined number of spare elements, each of said spare elements selecting a predetermined number of spare memory cells from said spare memory cells to replace a defective element in a corresponding one of said repair regions;

a plurality of redundant control circuits, each of which is coupled to a corresponding one of said spare elements in a corresponding one of said spare element groups; and a plurality of control parts, each of which is coupled to a corresponding one of said spare element groups, each of said control parts controlling the replacement of one of said spare elements in said corresponding one of said spare element groups for a defective element on the basis of at least an output of said redundant control circuits corresponding to said one of said spare elements in said corresponding one of said spare element groups, wherein said repair regions are set so that, in an operation mode in which the number of said elements simultaneously activated is large, a plurality of said elements are simultaneously activated in each of said repair regions and said elements are simultaneously activated in said plurality of repair regions, and in an operation mode in which the number of said elements simultaneously activated is small, the number of said repair regions, in which said elements are simultaneously activated, decreases.

15. A semiconductor memory device as set forth in claim 14, wherein assuming that the number of said elements simultaneously activated in each of said repair regions is m ($\geq 2$), each of said repair regions is divided into m sub-regions so that the number of said elements simultaneously activated in each of said sub-regions is one, each of said redundant control circuits comprising:

a sub-region determining circuit for determining one of said m sub-regions in which a defective element is capable of being replaced with one of said spare elements corresponding to a corresponding one of said redundant control circuits;

an address storage circuit for programmably storing an address of said defective element;

a comparing circuit for comparing an input address with an address stored in said address storage circuit to output a coincidence signal when said input address is coincident with said stored address, and to output a mismatch signal when said input address is not coincident with said stored address;

a trigger signal generating circuit for generating a trigger signal on the basis of said mismatch signal outputted from said comparing circuit and a mismatch signal generated from another comparing circuit in another redundant control circuit corresponding to another spare element, which belongs to one of said spare element groups and is not activated simultaneously with a spare element corresponding to said redundant control circuit; and a non-replacement command signal generating circuit for generating m non-replacement command signals for commanding whether said spare element is replaced for each of said m sub-regions, on the basis of said tier signal outputted from said trigger signal generating circuit, said mismatch signal outputted from said comparing circuit, and an output of said sub-region determining circuit.

* * * * *